(12) United States Patent
Sung et al.

(10) Patent No.: US 10,903,196 B2
(45) Date of Patent: Jan. 26, 2021

(54) SEMICONDUCTOR PACKAGES INCLUDING BRIDGE DIE

(71) Applicant: SK hynix Inc., Icheon-si (KR)

(72) Inventors: Ki Jun Sung, Cheongju-si (KR); Sang Hyuk Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/690,816

(22) Filed: Nov. 21, 2019

(65) Prior Publication Data

US 2020/0091123 A1   Mar. 19, 2020

Related U.S. Application Data

(63) Continuation-in-part of application No. 16/197,130, filed on Nov. 20, 2018.

(30) Foreign Application Priority Data

Apr. 30, 2018 (KR) .................. 10-2018-0050264
Jul. 15, 2019 (KR) .................. 10-2019-0085391

(51) Int. Cl.
*H01L 25/10* (2006.01)
*H01L 23/498* (2006.01)
(Continued)

(52) U.S. Cl.
CPC ........ *H01L 25/105* (2013.01); *H01L 23/3128* (2013.01); *H01L 23/3135* (2013.01);
(Continued)

(58) Field of Classification Search
CPC .............. H01L 25/105; H01L 23/3128; H01L 23/3135; H01L 23/49816; H01L 23/49822;
(Continued)

(56) References Cited

U.S. PATENT DOCUMENTS 8,263,439 B2   9/2012 Marimuthu et al.
2011/0024916 A1   2/2011 Marimuthu et al.
(Continued)

FOREIGN PATENT DOCUMENTS

KR   101236798 B1   2/2013
KR   101874803 B1   8/2018

*Primary Examiner* — Fernando L Toledo
*Assistant Examiner* — Neil R Prasad
(74) *Attorney, Agent, or Firm* — William Park & Associates Ltd.

(57) ABSTRACT

A semiconductor package includes first and second semiconductor dies, first and second redistributed line structures, a first bridge die, and a vertical connector. The first semiconductor die and the first bridge die are disposed on the first redistributed line structure. The first bridge die is disposed to provide a level difference between the first semiconductor die and the first bridge die, the first bridge die having a height that is less than a height of the first semiconductor die. The second redistributed line structure has a protrusion, laterally protruding from a side surface of the first semiconductor die when viewed from a plan view, and a bottom surface of the second redistributed line structure is in contact with a top surface of the first semiconductor die. The second semiconductor die is disposed on the second redistributed line structure. The vertical connector is disposed between the bridge die and the protrusion of the second redistributed line structure to support the protrusion.

18 Claims, 17 Drawing Sheets

(51) Int. Cl.
*H01L 23/31* (2006.01)
*H01L 23/538* (2006.01)

(52) U.S. Cl.
CPC .. *H01L 23/49816* (2013.01); *H01L 23/49822* (2013.01); *H01L 23/49827* (2013.01); *H01L 23/5383* (2013.01); *H01L 23/5385* (2013.01); *H01L 23/5389* (2013.01)

(58) Field of Classification Search
CPC ........... H01L 23/49827; H01L 23/5383; H01L 23/5385; H01L 23/5389
See application file for complete search history.

(56) References Cited

U.S. PATENT DOCUMENTS

| | | | |
|---|---|---|---|
| 2015/0235915 A1* | 8/2015 | Liang | H01L 21/4857 361/764 |
| 2016/0043047 A1* | 2/2016 | Shim, II | H01L 23/5385 257/773 |
| 2018/0151501 A1* | 5/2018 | Yu | H01L 24/20 |
| 2019/0206799 A1* | 7/2019 | Keser | H01L 25/16 |

* cited by examiner

SEMICONDUCTOR PACKAGES INCLUDING BRIDGE DIE

CROSS-REFERENCE TO RELATED APPLICATIONS

The present application is a continuation-in-part of U.S. patent application Ser. No. 16/197,130, filed on Nov. 20, 2018, which claims priority under 35 U.S.C 119(a) to Korean Patent Application No. 10-2018-0050264, filed on Apr. 30, 2018, and the present application claims priority under 35 U.S.C 119(a) to Korean Patent Application No 10-2019-0085391, filed on Jul. 15, 2019.

BACKGROUND

1. Technical Field

Various embodiments of the present disclosure generally relate to semiconductor package technologies and, more particularly, to semiconductor packages including a bridge die.

2. Related Art

Recently, semiconductor packages having a high density and capable of operating at a high speed have been required in various electronic systems. In addition, the semiconductor packages have been developed to have a structure of a relatively small form factor. In order to realize such semiconductor packages, a lot of effort has been focused on flip chip stack technology. Moreover, in order to realize the semiconductor packages having a reduced thickness, a lot of effort has been focused on wafer level package technology.

SUMMARY

According to an embodiment, a semiconductor package includes a first semiconductor die disposed on a first redistributed line structure, a first bridge die, disposed on the first redistributed line structure to provide a level difference between the first semiconductor die and the first bridge die, the first die having a height that is less than a height of the first semiconductor die, and a second redistributed line structure, stacked on the first semiconductor die such that a bottom surface of the second redistributed line is in contact with a top surface of the first semiconductor die. The second redistributed line structure is disposed to have a protrusion, laterally protruding from a side surface of the first semiconductor die when viewed from a plan view. A second semiconductor die is disposed on the second redistributed line structure. A vertical connector is disposed between the first bridge die and the protrusion of the second redistributed line structure to support the protrusion. The first bridge die includes a first through via therein.

According to another embodiment, a semiconductor package includes a first sub-package, including a central portion and a recessed edge portion, with a top surface of the recessed edge portion being lower than a top surface of the central portion. A second sub-package is stacked on the first sub-package such that a bottom surface of the second sub-package is in contact with a top surface of the central portion of the first sub-package. The second sub-package has a protrusion which is vertically spaced apart from the recessed edge portion of the first sub-package. A vertical connector is disposed on the recessed edge portion to support the protrusion of the second sub-package. The first sub-package includes a first redistributed line structure, a first semiconductor die disposed on the first redistributed line structure, and a first bridge die disposed on the first redistributed line structure to provide a level difference between the first semiconductor die and the first bridge die, the first bridge die having a height which is less than a height of the first semiconductor die. The first bridge die includes a first through via and a first post bump. A first molding layer surrounds the first bridge die and the first semiconductor die to reveal a top surface of the first post bump. The vertical connector is connected to the first post bump.

DETAILED DESCRIPTION

Figure 1:
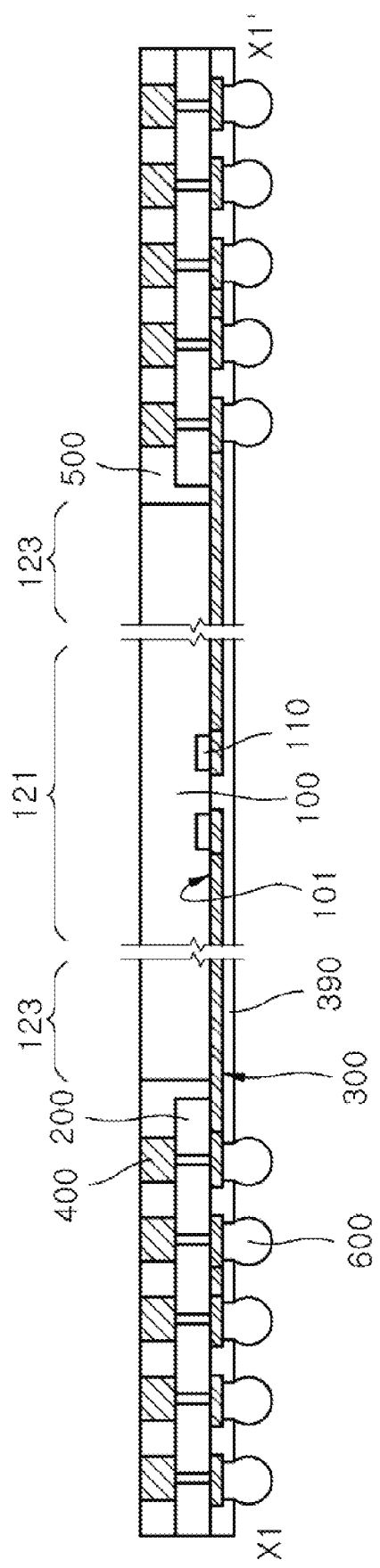
FIGS. 1 to 3 are cross-sectional views illustrating a semiconductor package according to an embodiment.

The terms used herein may correspond to words selected in consideration of their functions in embodiments of the present disclosure, and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
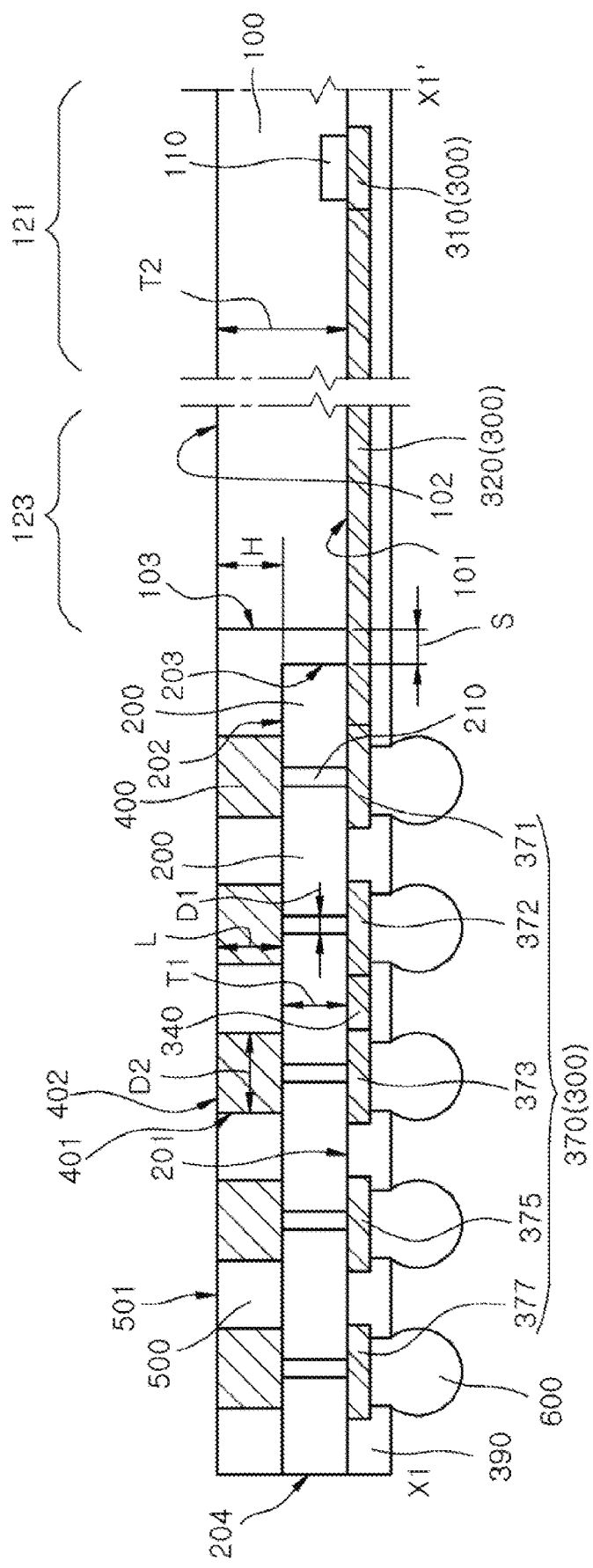
Figure 3:
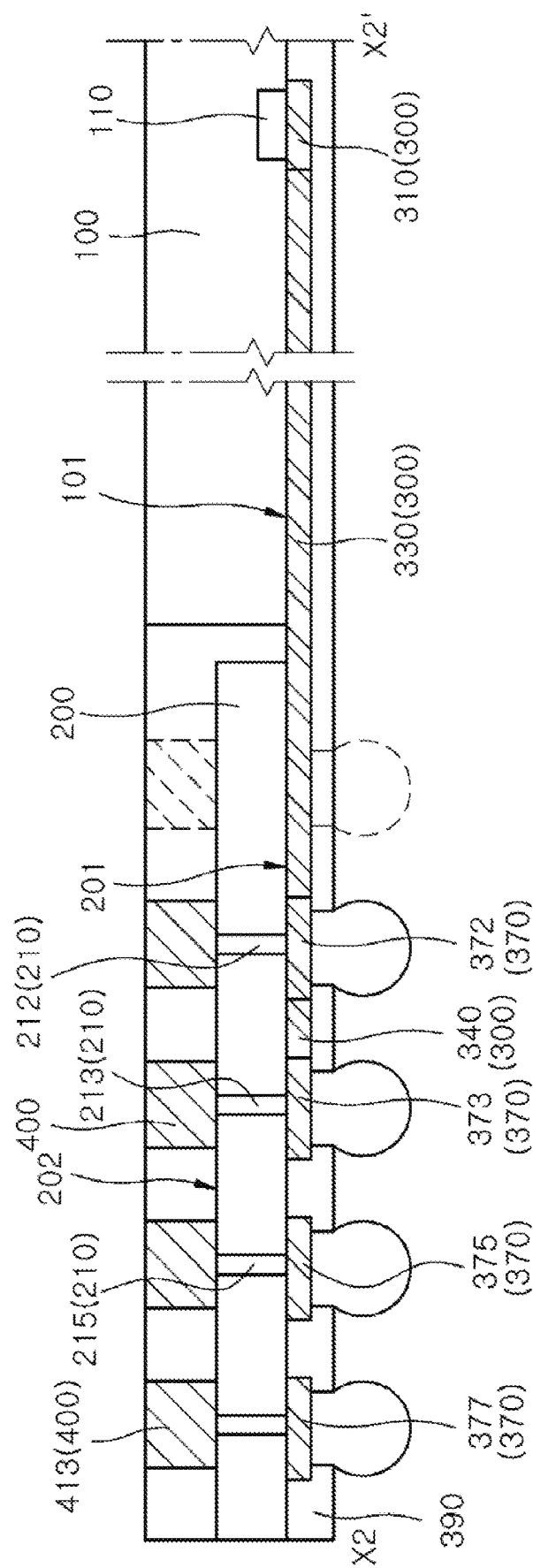
Figure 4:
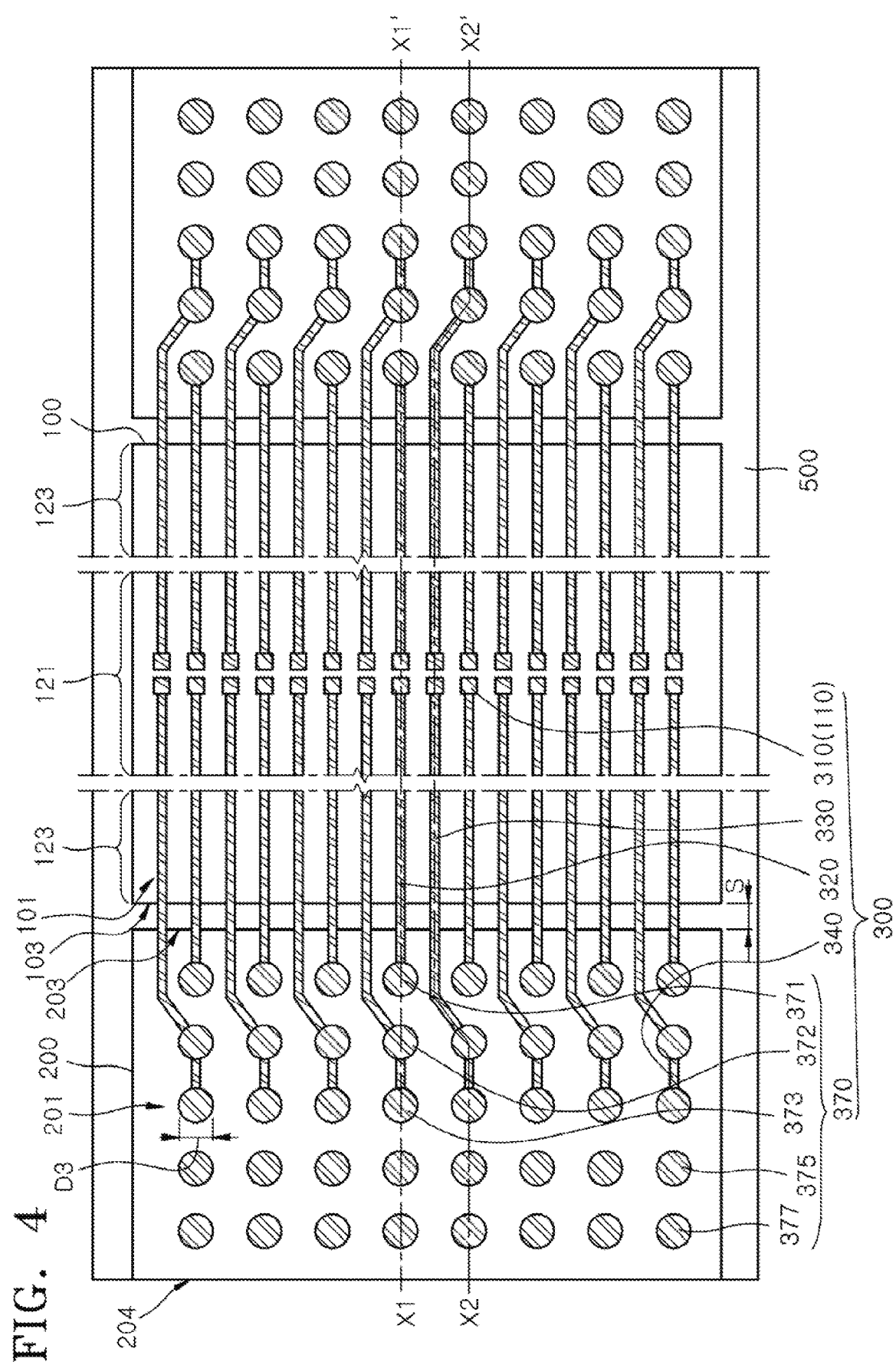
FIGS. 4 and 5 are plan views illustrating a semiconductor package according to an embodiment.
Figure 5:
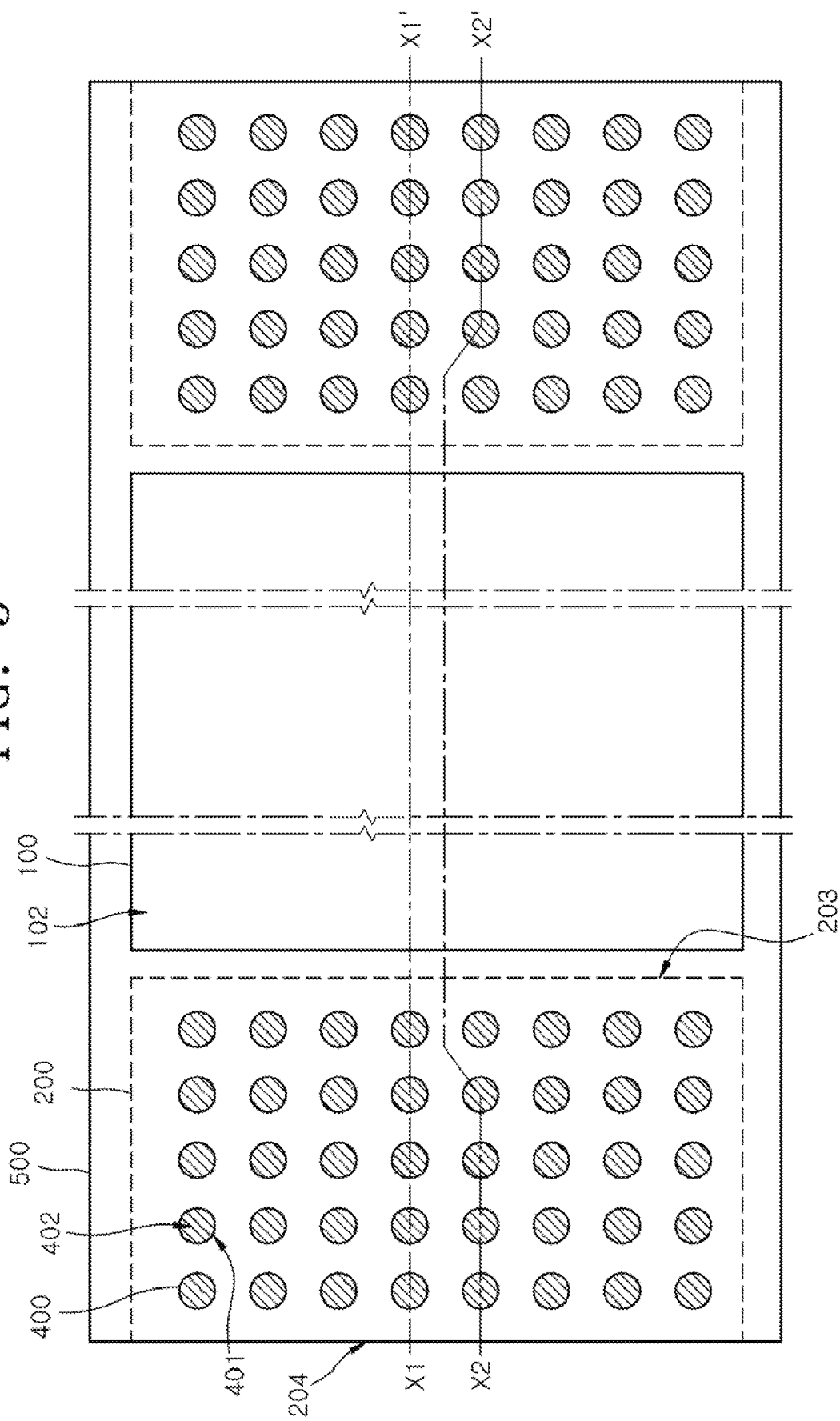

FIGS. 1 to 3 are cross-sectional views illustrating a semiconductor package 10 according to an embodiment. FIGS. 4 and 5 are plan views illustrating the semiconductor package 10 of FIGS. 1 to 3. FIG. 1 is a cross-sectional view taken along a line X1-X1' of FIGS. 4 and 5. FIG. 2 is an enlarged cross-sectional view taken along portions of a line X1-X1' of FIGS. 4 and 5. FIG. 3 is an enlarged cross-sectional view taken along portions of a line X2-X2' of FIGS. 4 and 5. FIG. 4 is a plan view taken at a level of a first surface 101 of a semiconductor die 100 included in the semiconductor package 10 of FIG. 1. For the purpose of ease and convenience in explanation, a dielectric layer 390 and connectors 600 illustrated in FIG. 1 are omitted in FIG. 4. FIG. 5 is a plan view taken at a level of a second surface 102 of the semiconductor die 100 included in the semiconductor package 10 of FIG. 1.

Referring to FIG. 1, the semiconductor package 10 may be configured to include the semiconductor die 100, a bridge die 200, and redistribution lines 300. The bridge die 200 may be disposed to be spaced apart from the semiconductor die 100 in a plan view. The bridge die 200 may include one die disposed at only one side of the semiconductor die 100 or may include two dies respectively disposed at both sides of the semiconductor die 100. Each of the redistribution lines 300 may be configured to include a conductive pattern that electrically connects the semiconductor die 100 to the bridge die 200. The semiconductor package 10 may further include conductive post bumps 400 attached to the bridge die 200 and a mold layer 500. In addition, the semiconductor package 10 may further include the connectors 600, each of which is connected to a portion of each of the redistribution lines 300. The dielectric layer 390 may be disposed to cover the redistribution lines 300 to electrically isolate the redistribution lines 300 from each other.

Referring to FIGS. 1 and 2, the semiconductor die 100 may have the first surface 101 on which the dielectric layer 390 is disposed, the second surface 102 located opposite to the dielectric layer 390, and second side surfaces 103 extending from edges of the first surface 101 to edges of the second surface 102. The first surface 101 of the semiconductor die 100 may correspond to an active surface on which integrated circuits are disposed. The second surface 102 of the semiconductor die 100 may correspond to a bottom surface or a backside surface of the semiconductor die 100, which is opposite to the active surface. The terms "first" and "second" in the first surface 101 and the second surface 102 are only used to distinguish the surfaces from each other, but not used to mean a particular sequence of the surfaces.

Contact pads 110 may be disposed on the first surface 101 of the semiconductor die 100. The contact pads 110 may be conductive patterns that are used as paths for electrically connecting the semiconductor die 100 to an external device or system. The contact pads 110 may be center pads which are arrayed in a center region 121 of the semiconductor die 100, as illustrated in FIG. 4. The contact pads 110 may be arrayed in two columns on the first surface 101 of the center region 121. The semiconductor die 100 may include the center region 121 and two edge regions 123 respectively located at both sides of the center region 121.

Referring to FIG. 2, the bridge die 200 may be disposed to be spaced apart from the second side surface 103 of the semiconductor die 100. The bridge die 200 may have a third surface 201 and a fourth surface 202 which are opposite to each other as well as a third side surface 203 and a fourth side surface 204 which are opposite to each other. The bridge die 200 may be disposed such that the third surface 201 of the bridge die 200 faces the same direction as the first surface 101 of the semiconductor die 100. The third surface 201 of the bridge die 200 may be coplanar with the first surface 101 of the semiconductor die 100. That is, the third surface 201 of the bridge die 200 may be located at substantially the same level as the first surface 101 of the semiconductor die 100.

Referring to FIGS. 2 and 4, the bridge die 200 may be disposed beside the semiconductor die 100 such that the third side surface 203 of the bridge die 200 faces the second side surface 103 of the semiconductor die 100. The bridge die 200 may be spaced apart from the semiconductor die 100 by a certain distance S.

Referring to FIG. 2, there may be a level difference H between the fourth surface 202 of the bridge die 200 and the second surface 102 of the semiconductor die 100. The bridge die 200 may be disposed beside the semiconductor die 100 such that the fourth surface 202 of the bridge die 200 and the second surface 102 of the semiconductor die 100 constitute a step structure. The bridge die 200 may be thinner than the semiconductor die 100. A thickness T1 (also, referred to as a first thickness) corresponding to a distance between the third and fourth surfaces 201 and 202 of the bridge die 200 may be less than a thickness T2 (also, referred to as a second thickness) corresponding to a distance between the first and second surfaces 101 and 102 of the semiconductor die 100. In an embodiment, the thickness T1 of the bridge die 200 may be approximately half the thickness T2 of the semiconductor die 100.

The bridge die 200 may include through vias 210 that penetrate a body of the bridge die 200 to extend from the third surface 203 to the fourth surface 204. The body of the bridge die 200 may be comprised of a semiconductor material such as a silicon material. If the body of the bridge die 200 is comprised of a silicon material, the through vias 210 may be formed using a silicon processing technology. In such a case, the through vias 210 may be through silicon vias (TSVs) having a relatively fine diameter D1 (also, referred to as a first diameter in the specification). The through vias 210 may be formed of a conductive metal material, for example, a metal material including a copper material.

Since the thickness T1 of the bridge die 200 is relatively less than the thickness T2 of the semiconductor die 100, a length (corresponding to a height) of the through vias 210 may be relatively short. For example, if the bridge die 200 is replaced with a thick bridge die having substantially the same thickness as the semiconductor die 100, through vias penetrating the thick bridge die may have a length which is greater than the length of the through vias 210. However, according to an embodiment, the through vias 210 may be formed to penetrate the bridge die 200 which is thinner than the semiconductor die 100. Thus, the through vias 210 may be formed to have a relatively short length. In order to form the through vias penetrating the thick bridge die and having a fine diameter, it may be necessary to increase an aspect ratio of through via holes of the through vias. There may be limitations in increasing an aspect ratio of the through via holes without increasing the diameter of the through via holes. That is, if a length of the through vias increases, a diameter of the through vias may also increase. However, according to the described embodiment, the thickness T1 of the bridge die 200 may have a relatively small value. Thus, the through vias 210 penetrating the bridge die 200 may be formed to have a relatively short length with a fine diameter D1. Accordingly, it may be possible to increase the number of the through vias 210 disposed in the bridge die 200 because the through vias 210 are formed to have the fine diameter D1.

Referring to FIG. 2, the conductive post bumps 400 may be disposed to protrude from the fourth surface 202 of the bridge die 200. The conductive post bumps 400 may be electrically connected to the through vias 210, respectively. The conductive post bumps 400 may be disposed to respectively overlap with the through vias 210 in a plan view. The conductive post bumps 400 may protrude from the fourth surface 202 of the bridge die 200 such that a side surface of first side surfaces 401 of each of the conductive post bumps 400 faces an upper portion of the second side surface 103 of the semiconductor die 100.

The semiconductor package 10 may include the mold layer 500 covering the fourth surface 202 of the bridge die 200. The mold layer 500 may be formed to cover the fourth surface 202 of the bridge die 200. The mold layer 500 may be formed to surround the side surfaces of the conductive post bumps 400. The mold layer 500 may be formed to directly cover the first side surfaces 401 of the conductive post bumps 400. The mold layer 500 may be formed to reveal top surfaces 402 of the conductive post bumps 400. The top surfaces 402 of the conductive post bumps 400 may be coplanar with a top surface 501 of the mold layer 500.

Other connectors (not illustrated) may be attached or connected to the top surfaces 402 of the conductive post bumps 400 to electrically connect the conductive post bumps 400 to another semiconductor package or an external device. The conductive post bumps 400 may be surrounded by the mold layer 500. The conductive post bumps 400 may substantially penetrate portions of the mold layer 500 covering the fourth surface 202 of the bridge die 200. Thus, the conductive post bumps 400 may act as extension lines for extending the electrical paths of the through vias 210 up to the top surface 501 of the mold layer 500.

Whereas a space between the through vias 210 is filled with a semiconductor material such as a silicon material, a space between the conductive post bumps 400 may be filled with a dielectric layer such as the mold layer 500 including an epoxy molding compound (EMC) material.

Since the through vias 210 penetrate the body of the bridge die 200 comprised of a semiconductor material, an impedance component of each of the through vias 210 may increase as compared with a case in which the through vias 210 penetrate an insulation substrate. In addition, if the through vias 210 are disposed in a limited region or a limited space, a distance between the through vias 210 may be reduced to cause a crosstalk phenomenon due to noise signals to occur more frequently. The crosstalk phenomenon may affect a signal transmission characteristic or a signal integrity characteristic of semiconductor packages while the semiconductor packages operate at a high frequency. According to the described embodiment, a space between the post bumps 400 may be filled with a dielectric material, for example, an epoxy molding compound (EMC) material. Thus, the suppressing of a total crosstalk phenomenon of the semiconductor package 10 may be improved due to the presence of a dielectric material (i.e., the mold layer 500) filling a space between the post bumps 400 even though the through vias 210 are disposed to penetrate the bridge die 200 comprised of a semiconductor material. For example, a silicon material may have a dielectric constant of approximately 11.68 at a frequency of 1.0 KHz at room temperature, and an EMC material may have a dielectric constant of approximately 3.7 at a frequency of 1.0 KHz at room temperature. This difference in dielectric constant between the bridge die 200 and the mold layer 500 may influence electrical characteristics such as a signal transmission characteristic or a signal integrity characteristic of the semiconductor package 10.

Each of the post bumps 400 may have a second diameter D2 which is greater than the first diameter D1 of each of the through vias 210. Since the first diameter D1 of each of the through vias 210 is less than the second diameter D2 of each of the post bumps 400 connected to the through vias 210, a distance between the through vias 210 may be relatively greater than a distance between the post bumps 400. That is, the post bumps 400 may be disposed such that a distance between the post bumps 400 is less than a distance between the through vias 210. For example, a distance between adjacent post bumps may be less than a distance between the corresponding adjacent through vias. In addition, a space between the post bumps 400 may be filled with a dielectric material, and a space between the through vias 210 may be filled with a semiconductor material. Since a distance between the through vias 210 may be relatively greater than a distance between the post bumps 400, noise generated due to interference between signals transmitted through adjacent through vias 210 may be reduced.

As described above, in order to reduce the noise generated due to interference between signals transmitted through adjacent through vias 210, it may be necessary to increase the distance between the through vias 210. In order to increase the distance between the through vias 210 without changing a pitch size of the through vias 210, it may require that the first diameter D1 is reduced. In order to form through vias 210 having the first diameter D1 corresponding to a fine diameter which is less than the second diameter D2 penetrating the bridge die 200, it may be required to reduce the thickness T1 of the bridge die 200. According to an embodiment, the bridge die 200 may be provided to have the thickness T1 which is less than the thickness T2 of the semiconductor die 100. Thus, each of the through vias 210 may be formed to have a through silicon via (TSV) shape. As a result, a distance between the through vias 210 may be increased to suppress generation of noise due to interference between signals transmitted through adjacent through vias 210.

Each of the post bumps 400 may have a shape of a metal post including a copper material. A length L (i.e., a height) of the post bumps 400 may be less than the second diameter D2 of the post bumps 400. For example, each of the post bumps 400 may have the length L of approximately 60 micrometers. The length L of the post bumps 400 may be about the same as the first thickness T1 of the bridge die 200. For example, the bridge die 200 may have the first thickness T1 of approximately 50 micrometers. Each of the post bumps 400 may have the second diameter D2 of approximately 100 micrometers. In contrast, each of the through vias 210 may have the first diameter D1 of approximately 0.5 micrometers. Since the post bumps 400 are formed to have a relatively large diameter (i.e., the second diameter D2) as compared with the through vias 210, connectors (not illustrated) such as solder bumps may be directly connected to the respective top surfaces 402 of the post bumps 400. Thus, extra conductive pads for increasing contact areas between the connectors (not illustrated) and the top surfaces 402 of the post bumps 400 might not be required.

The mold layer 500 may extend to fill a space between the second side surface 103 of the semiconductor die 100 and the first side surfaces 401 of the post bumps 400. The mold layer 500 may extend to substantially cover an entire portion of the second side surface 103 of the semiconductor die 100. The mold layer 500 may further extend to cover the third side surface 203 of the bridge die 200, which faces the second side surface 103 of the semiconductor die 100. The mold layer 500 may further extend to fill a space between the second side surface 103 of the semiconductor die 100 and the third side surface 203 of the bridge die 200.

Referring to FIGS. 2 and 5, the mold layer 500 may be formed to reveal the second surface 102 of the semiconductor die 100. The second surface 102 of the semiconductor die 100 may be coplanar with the top 501 of the mold layer 500. That is, the top 501 of the mold layer 500 may be located at substantially the same level as the second surface 102 of the semiconductor die 100. The top surfaces 402 of the post bumps 400 may be coplanar with the second surface 102 of the semiconductor die 100. Since the mold layer 500 is formed to reveal the second surface 102 of the semiconductor die 100, a total thickness of the semiconductor package 10 may have a reduced thickness as compared with a case where the mold layer 500 is formed to cover an entire portion of the semiconductor die 100.

The mold layer 500 may be formed to reveal the fourth side surface 204 of the bridge die 200 opposite to the semiconductor die 100. A heat radiation efficiency of the semiconductor package 10 may be improved by forming the mold layer 500 to reveal the fourth side surface 204 of the bridge die 200. The fourth side surface 204 of the bridge die 200 and the second surface 102 of the semiconductor die 100, which are revealed by the mold layer 500, may act as heat radiation paths of the semiconductor package 10.

The mold layer 500 may cover the third side surface 203 of the bridge die 200 and the second side surface 103 of the semiconductor die 100 and may extend to cover the fourth surface 202 of the bridge die 200 and the first side surfaces 401 of the post bumps 400. Accordingly, a binding force of the mold layer 500 to the bridge die 200 may be improved because the post bumps 400 are combined with the through vias 210 and the mold layer 500 extends to surround the first side surfaces 401 of the post bumps 400.

Referring again to FIGS. 2 and 4, the semiconductor package may further include the redistribution lines 300. The redistribution lines 300 may be disposed to electrically connect the semiconductor die 100 to the through vias 210. Each of the redistribution lines 300 may include a conductive pattern that electrically connects one of the contact pads 110 of the semiconductor die 100 to any one of the through vias 210. The redistribution lines 300 may be formed to include a metal material such as an aluminum (Al) material, a copper (Cu) material, a gold (Au) material, etc.

Each of the redistribution lines 300 may include a pad overlap portion 310, an extension line 320 or 330+340, and a via pad 370. The extension lines 320 and 330+340 may include a first extension line 320, a second extension line 330, and a third extension line 340. The pad overlap portion 310 may be bonded to any one of the contact pads 110 of the semiconductor die 100. The pad overlap portion 310 may be in contact with one of the contact pads 110 of the semiconductor die 100 to electrically connect the one of the contact pads 110 to any one of the extension lines 320, 330, and 340. The pad overlap portion 310 may overlap with any one of the contact pads 110 of the semiconductor die 100 to have a pad shape. The via pads 370 of the redistribution lines 300 may be arrayed to have a pitch size which is greater than a pitch size of the contact pads 110.

The via pad 370 may be a conductive pattern connected to any one of the through vias 210 of the bridge die 200. First ends of the through vias 210 may be respectively connected to the post bumps 400, and second ends of the through vias 210 may be respectively connected to the via pads 370 of the redistribution lines 300. The via pads 370 of the redistribution lines 300 may be disposed on the third surface 201 of the bridge die 200 opposite to the post bumps 400, and the post bumps 400 may be disposed on the fourth surface 202 of the bridge die 200 opposite to the via pads 370. The through vias 210 may correspond to conductive patterns that electrically connect the via pads 370 to the respective post bumps 400. The via pads 370 may be disposed to overlap with the respective through vias 210 in a plan view, and the post bumps 400 may be disposed to overlap with the respective through vias 210 in a plan view. Thus, the via pads 370 may also be disposed to overlap with the post bumps 400, respectively, when viewed from a plan view.

The via pads 370 may be conductive patterns having a third diameter D3 which is substantially equal to or about the same as the second diameter D2 of the post bumps 400. The via pads 370 may have a third diameter D3 which is greater than the first diameter D1 of the through vias 210.

The via pads 370 of the redistribution lines 300 may be arrayed in a plurality of columns on the third surface 201 of the bridge die 200. As illustrated in a plan view of FIG. 4, the via pads 370 may include via pads 371 arrayed in a first column, via pads 372 arrayed in a second column, via pads 373 arrayed in a third column, via pads 375 arrayed in a fourth column, and via pads 377 arrayed in a fifth column. The first to fifth columns may be sequentially located to get farther from the semiconductor die 100. The via pads 370 may be arrayed in a checkerboard shape (i.e., a matrix form) as illustrated in FIG. 4. However, the embodiment illustrated in FIG. 4 may be merely one of various embodiments of the present disclosure. For example, in some other embodiments, the via pads 370 in each column may be arrayed in a zigzag fashion along a column direction when viewed from a plan view.

The first extension lines 320 of the redistribution lines 300 may correspond to extension lines that electrically connect the via pads 371 arrayed in the first column to a first group of the pad overlap portion 310. That is, the first extension lines 320 may electrically connect the via pads 371 arrayed in the first column to a first group of the contact pads 110. Some of the through vias 210 may be electrically connected to some of the contact pads 110 of the semiconductor die 100 through the via pads 371 arrayed in the first column, the first extension lines 320, and the first group of the pad overlap portion 310. The first extension lines 320 may be conductive patterns that extend from the first surface 101 of the semiconductor die 100 onto the third surface 201 of the bridge die 200 across the mold layer 500.

Referring to FIGS. 3 and 4, the second extension lines 330 of the redistribution lines 300 may correspond to extension lines that electrically connect the via pads 372 arrayed in the second column to a second group of the pad overlap portion 310. That is, the second extension lines 330 may electrically connect the via pads 372 arrayed in the second column to a second group of the contact pads 110. Some of the through vias 210 may be electrically connected to some of the contact pads 110 of the semiconductor die 100 through the via pads 372 arrayed in the second column, the second extension lines 330, and the second group of the pad overlap portion 310. The second extension lines 330 may be conductive patterns that extend from the first surface 101 of the semiconductor die 100 onto the third surface 201 of the bridge die 200 across the mold layer 500. As illustrated in FIG. 4, the first extension lines 320 and the second extension lines 330 may be alternately disposed.

The third extension lines 340 of the redistribution lines 300 may correspond to extension lines that electrically connect the via pads 372 arrayed in the second column to the via pads 373 arrayed in the third column. Since the third extension lines 340 electrically connect the via pads 372 arrayed in the second column to the via pads 373 arrayed in the third column, first through vias 212 coupled to the via pads 372 in the second column among the through vias 210 may be electrically connected to second through vias 213 coupled to the via pads 373 in the third column among the through vias 210. The third extension lines 340 may electrically connect the first through vias 212 to the second through vias 213 adjacent to the first through vias 212. The third extension lines 340 may be disposed on the third surface 201 of the bridge die 200.

One of the first through vias 212 and one of the second through vias 213 may be electrically connected to any one of the second extension lines 330 by any one of the third extension lines 340. Even though signals are abnormally transmitted through the first through vias 212, the signals may be normally transmitted to the second extension lines 330 through the second through vias 213. Thus, it may be possible to realize reliable signal paths of the semiconductor die 100 included in the semiconductor package 10. Whereas the second extension lines 330 provide data signal paths, the first extension lines 320 may be used as power supply lines including power voltage lines and ground voltage lines.

The via pads 375 arrayed in the fourth column and the via pads 377 arrayed in the fifth column may be disposed on the third surface 201 of the bridge die 200 to act as first dummy pads. That is, the via pads 375 in the fourth column and the via pads 377 in the fifth column may be electrically disconnected and isolated from the first to third extension lines 320, 330, and 340. Since the via pads 375 in the fourth column and the via pads 377 in the fifth column correspond to the first dummy pads, the through vias 210 connected to the via pads 375 in the fourth column and the via pads 377 in the fifth column may also correspond to first dummy through vias 215 which are electrically isolated. The post dumps 400 connected to the first dummy through vias 215 may also correspond to first dummy post bumps 413 which are electrically isolated. The first dummy pads 375 and 377, the first dummy through vias 215, and the first dummy post bumps 413 may be provided as redundant preliminary members.

Referring again to FIG. 2, the semiconductor package 10 may include the dielectric layer 390 that reveals the via pads 370 and covers the first to third extension lines 320, 330, and 340 and the pad overlap portions 310 to electrically isolate the extension lines 320, 330, and 340 from each other. The dielectric layer 390 may be formed to cover the first surface 101 of the semiconductor die 100, the third surface 201 of the bridge die 200, and the mold layer 500 between the semiconductor die 100 and the bridge die 200. The dielectric layer 390 may include a solder resist layer revealing the via pads 370.

The connectors 600 may be attached to the revealed via pads 370 to electrically connect the semiconductor package 10 to an external device or another semiconductor package. The connectors 600 may be realized using solder bumps or solder balls.

Figure 6:
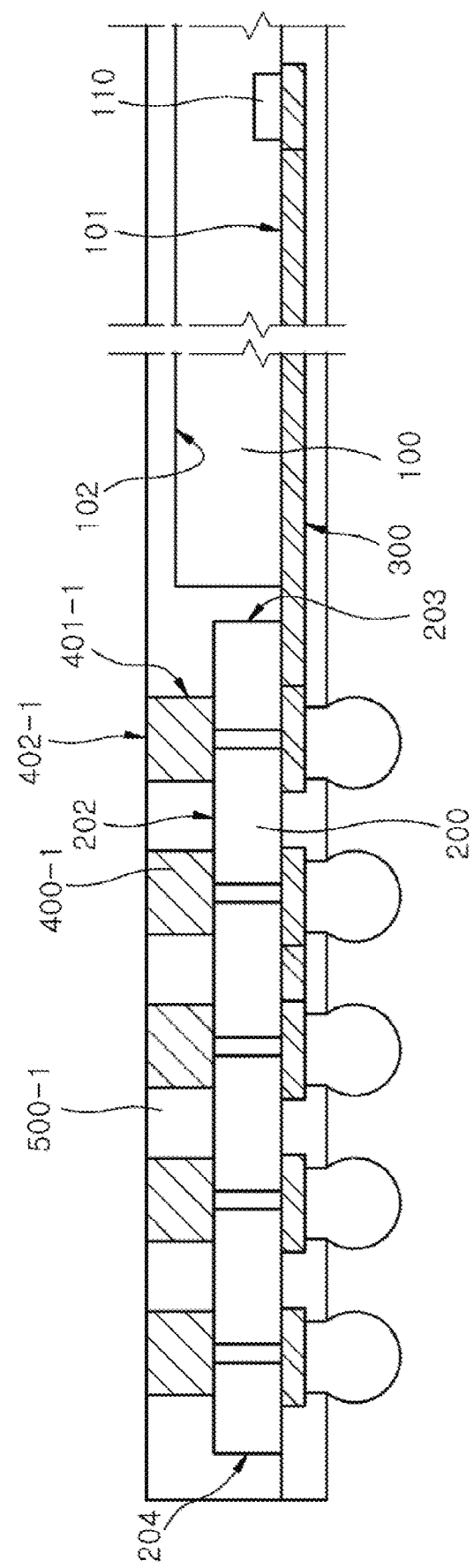
FIG. 6 is a cross-sectional view illustrating a semiconductor package according to an embodiment.

FIG. 6 is a cross-sectional view illustrating a semiconductor package 11 according to an embodiment. In FIG. 6, members having the same shapes as illustrated in FIGS. 1 to 5 denote substantially the same elements. In FIG. 6, the same reference numerals as used in FIGS. 1 to 5 denote substantially the same elements.

Referring to FIG. 6, the semiconductor package 11 may include a mold layer 500-1 having an expanded shape of the mold layer 500 included in the semiconductor package 10 of FIG. 2. The mold layer 500-1 may surround first side surfaces 401-1 of post bumps 400-1 and may reveal top surfaces 402-1 of the post bumps 400-1. The post bumps 400-1 may penetrate the mold layer 500-1 to have the same function as the post bumps 400 illustrated in FIG. 2. The mold layer 500-1 may cover the fourth surface 202 of the bridge die 200 and may extend to cover the fourth side surface 204 of the bridge die 200 opposite to the semiconductor die 100. Since the mold layer 500-1 covers the fourth surface 202 of the bridge die 200 to protect the bridge die 200, the bridge die 200 may not be exposed to external environment. Thus, the mold layer 500-1 may suppress damaging of the bridge die 200 by the external environment or formation of cracks in the bridge die 200. In addition, the mold layer 500-1 may extend to cover the second surface 102 of the semiconductor die 100 opposite to the contact pads 110.

Figure 7:
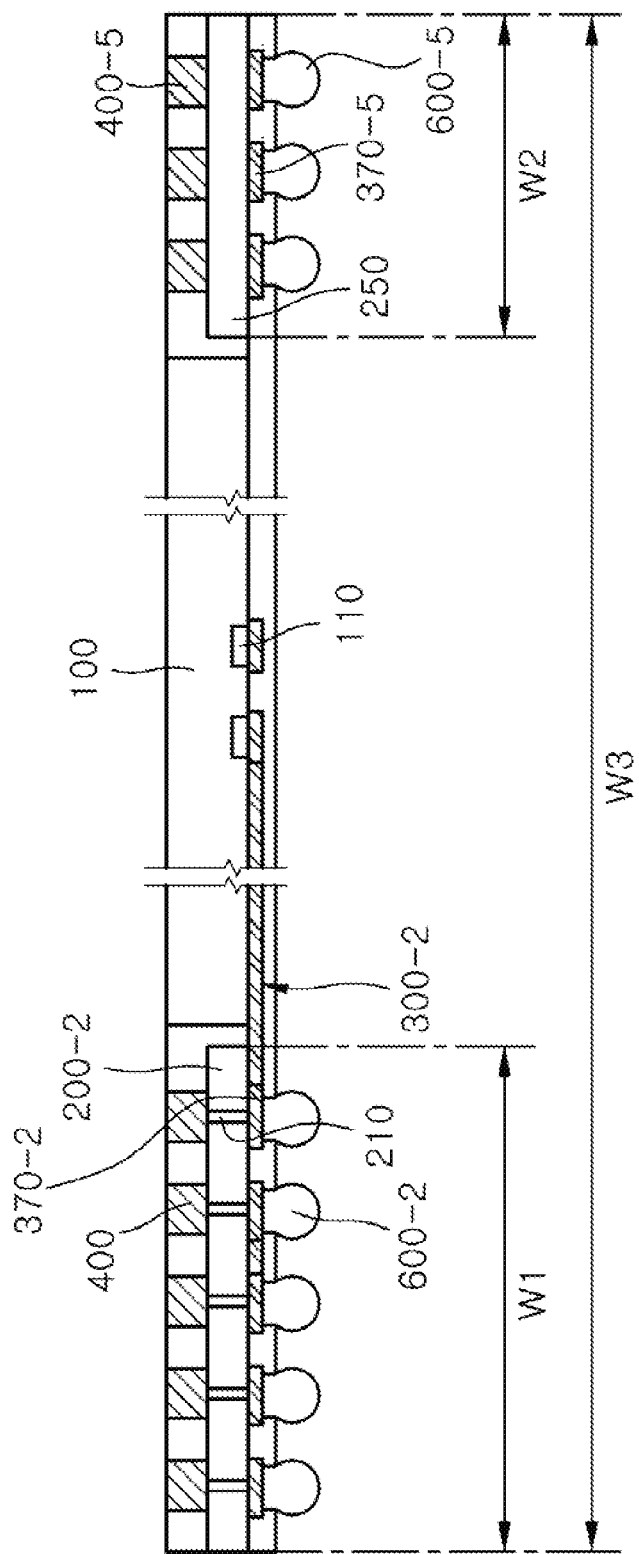
FIG. 7 is a cross-sectional view illustrating a semiconductor package according to an embodiment.
Figure 8:
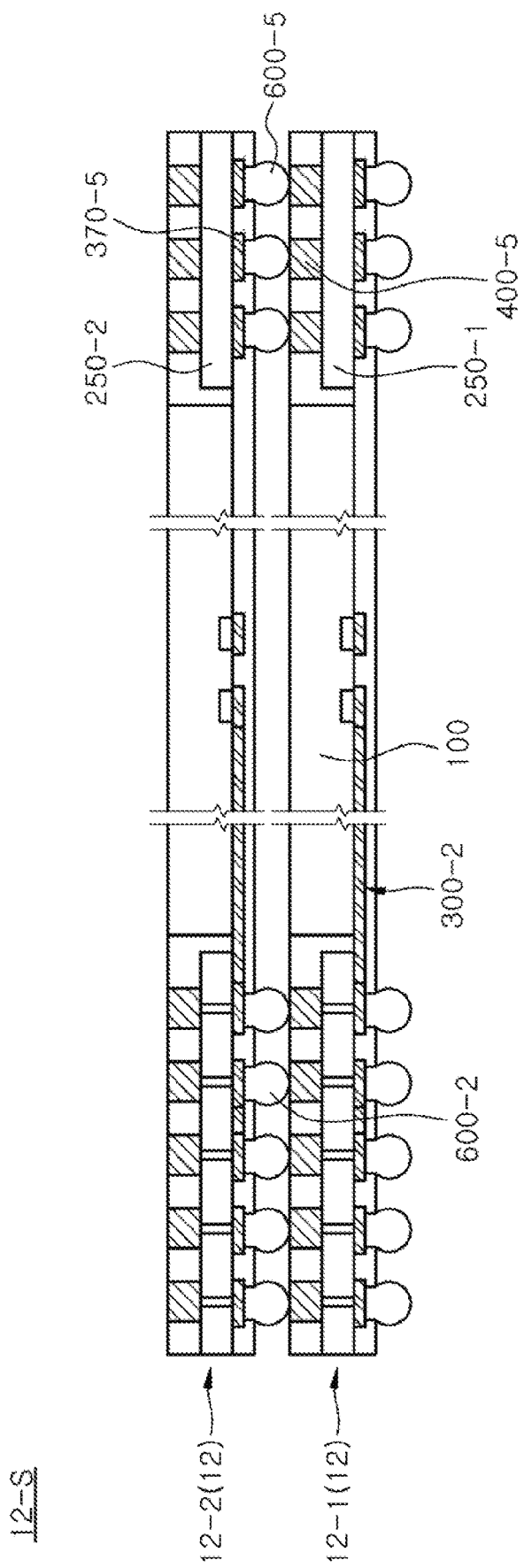
FIG. 8 is a cross-sectional view illustrating a semiconductor package according to an embodiment.

FIG. 7 is a cross-sectional view illustrating a semiconductor package 12 according to an embodiment. FIG. 8 is a cross-sectional view illustrating a semiconductor package 12-S according to an embodiment. The semiconductor package 12-S illustrated in FIG. 8 may correspond to a stack package including a couple of the semiconductor packages 12 which are vertically stacked. In FIGS. 7 and 8, members having the same shapes as illustrated in FIGS. 1 to 5 denote substantially the same elements. In FIGS. 7 and 8, the same reference numerals as used in FIGS. 1 to 5 denote substantially the same elements.

Referring to FIG. 7, the semiconductor package 12 may include a bridge die 200-2 located at one side of the semiconductor die 100. The semiconductor package 12 may also include redistribution lines 300-2 that electrically connect the through vias 210 of the bridge die 200-2 to the contact pads 110 of the semiconductor die 100. A dummy die 250 may be located at another side of the semiconductor die 100 opposite to the bridge die 200-2.

The dummy die 250 may have no through vias unlike the bridge die 200-2. Nevertheless, second dummy pads 370-5 may be disposed on the dummy die 250. Dummy connectors 600-5 may be attached to the second dummy pads 370-5 as connectors 600-2 are attached to via pads 370-2 which are connected to the through vias 210 penetrating a body of the bridge die 200-2. The second dummy pads 370-5 may be electrically isolated from the semiconductor die 100. Second dummy post bumps 400-5 disposed on the dummy die 250 may also be electrically isolated from the semiconductor die 100.

The dummy die 250 may correspond to a semiconductor die having a width W2 which is less than a width W1 of the bridge die 200-2. Thus, a total width W3 of the semiconductor package 12 may be reduced as compared with a case where the dummy die 250 has the same width as the bridge die 200-2. The dummy die 250 and the bridge die 200-2 may have substantially the same length in a direction perpendicular to a width direction in a plan view. In other embodiments, the dummy die 250 may have substantially the same size as the bridge die 200-2. Alternatively, a size of the dummy die 250 may be about the same as a size of the bridge die 200-2.

Referring to FIGS. 7 and 8, since the dummy die 250 and the bridge die 200-2 are respectively located at both sides of the semiconductor die 100, the semiconductor package 12 may have a stable structure due to a bump connection structure of the dummy die 250. Accordingly, when a first sub-package 12-1 having the same configuration as the semiconductor package 12 and a second sub-package 12-2 having the same configuration as the semiconductor package 12 are vertically stacked to provide the semiconductor package 12-S, the semiconductor package 12-S may be well balanced.

The first sub-package 12-1 and the second sub-package 12-2 may be physically bonded to each other and may be electrically connected to each other by the connectors 600-2. In such a case, the second dummy post bumps 400-5 disposed on a dummy die 250-1 of the first sub-package 12-1 may be bonded to the second dummy pads 370-5 disposed on a dummy die 250-2 of the second sub-package 12-2 using the dummy connectors 600-5. The dummy connectors 600-5, the second dummy post bumps 400-5, the second dummy pads 370-5, and the dummy dies 250-1 and 250-2 may act as balances for preventing the second sub-package 12-2 from being inclined. That is, the dummy connectors 600-5, the second dummy post bumps 400-5, the second dummy pads 370-5, and the dummy dies 250-1 and 250-2 may be introduced to help the second sub-package 12-2 keep a balance when the second sub-package 12-2 is stacked on the first sub-package 12-1. Therefore, the dummy connectors 600-5, the second dummy post bumps 400-5, the second dummy pads 370-5, and the dummy dies 250-1 and 250-2 may provide a symmetrical structure of the semiconductor package 12-S to prevent physical defects of the semiconductor package 12-S from being generated due to a non-symmetrical structure of the semiconductor package 12-S.

Figure 9:
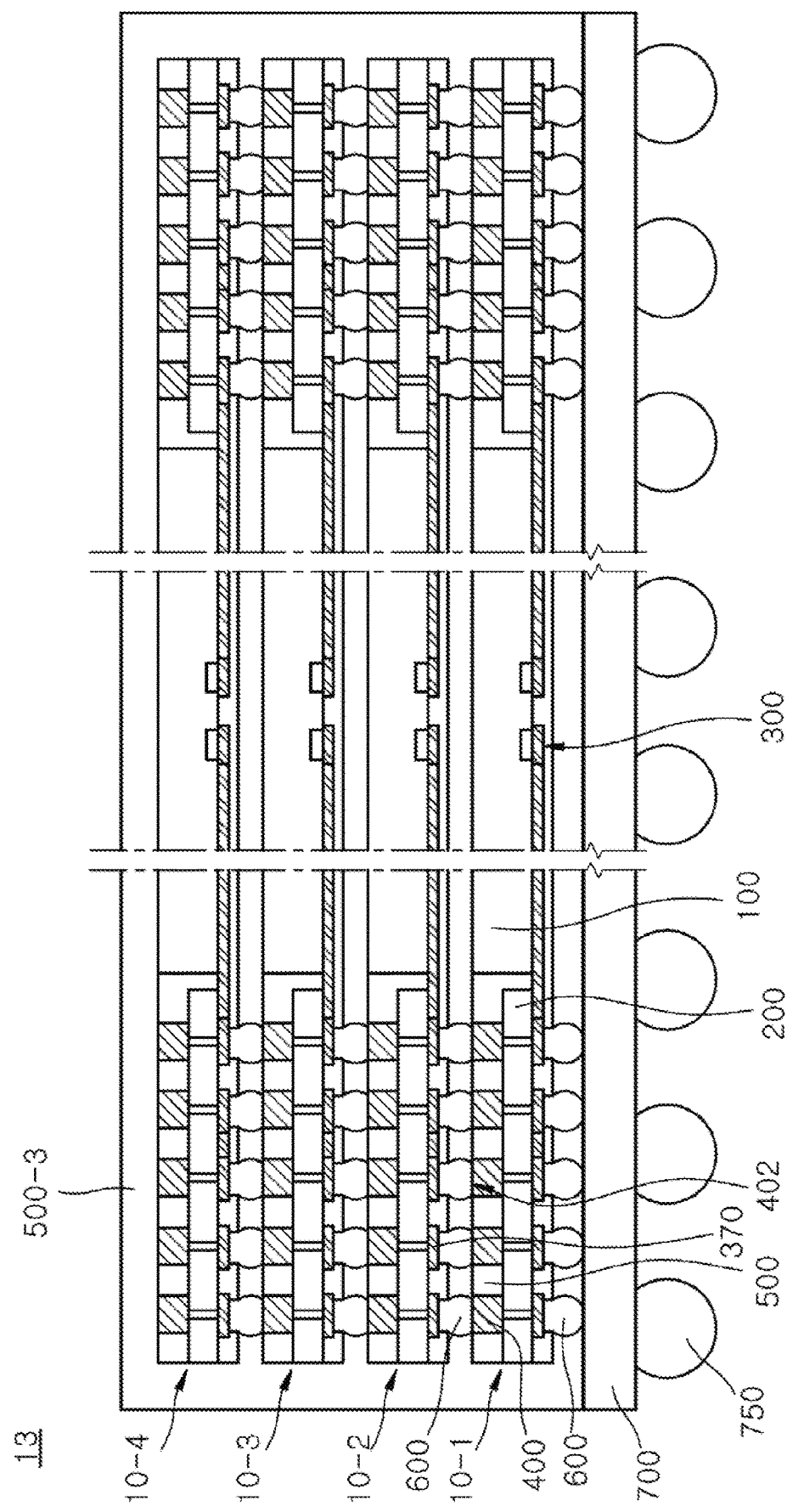
FIG. 9 is a cross-sectional view illustrating a semiconductor package according to an embodiment.

FIG. 9 is a cross-sectional view illustrating a semiconductor package 13 according to an embodiment. In FIG. 9, members having the same shapes as illustrated in FIGS. 1 to 5 denote substantially the same elements. In FIG. 9, the same reference numerals as used in FIGS. 1 to 5 denote substantially the same elements.

Referring to FIG. 9, the semiconductor package 13 may be configured to include a plurality of sub-packages (i.e., first to fourth sub-packages 10-1, 10-2, 10-3, and 10-4) which are vertically stacked on a package substrate 700. The package substrate 700 may include an interconnection structure layer having circuit interconnection lines, for example, a printed circuit board (PCB) or an interposer. Although FIG. 9 illustrates an example in which the semiconductor package 13 includes the first to fourth sub-packages 10-1, 10-2, 10-3, and 10-4, the number of the sub-packages may be set to be different according to various embodiments. Outer connectors 750 may be attached to the package substrate 700 to electrically connect the semiconductor package 13 to another electronic system.

Each of the first to fourth sub-packages 10-1, 10-2, 10-3, and 10-4 may have substantially the same configuration as the semiconductor package 10 described with reference to FIGS. 1 to 5. Each of the first to fourth sub-packages 10-1, 10-2, 10-3, and 10-4 may be configured to include the semiconductor die 100, a couple of the bridge dies 200 respectively disposed at both sides of the semiconductor die 100, the post bumps 400, the mold layer 500 (hereinafter, referred to as a first mold layer), and the redistribution lines 300. The first to fourth sub-packages 10-1, 10-2, 10-3, and 10-4 may be electrically connected to each other by the connectors 600. The connectors 600 may electrically connect the via pads 370 of an upper sub-package (e.g., the second sub-package 10-2) to the post bumps 400 of a lower sub-package (e.g., the first sub-package 10-1). The connectors 600 may be directly bonded to the post bumps 400 of the lower sub-package (e.g., the first sub-package 10-1). The top surface 402 of each of the post bumps 400 may have a sufficient area for being in contact with any one of the connectors 600. Thus, no extra conductive pads on the post bumps 400 may be required.

The semiconductor package 13 may further include a second mold layer 500-3 covering and protecting a stack structure of the first to fourth sub-packages 10-1, 10-2, 10-3, and 10-4. The second mold layer 500-3 may extend to fill spaces between the first to fourth sub-packages 10-1, 10-2, 10-3, and 10-4. The second mold layer 500-3 may include an encapsulant material such as an epoxy molding compound (EMC) material.

The semiconductor package 13 of FIG. 9 illustrates an example in which the semiconductor package 10 of FIG. 1 is employed in a module package or is used as sub-packages, which are capable of stacking, of a stack package. The bridge die (200 of FIG. 1) of the semiconductor package (10 of FIG. 1) may provide a vertical interconnection structure for electrically connecting the first to fourth sub-packages 10-1, 10-2, 10-3, and 10-4, which are vertically stacked to each other. The semiconductor package 11 or 12 illustrated in FIG. 6 or 7 may also be used as sub-packages constituting a stack package such as the semiconductor package 13 of FIG. 9.

As described above, the semiconductor package 13 of FIG. 9 may employ the semiconductor package 10 of FIG. 1 as each of the sub-packages which are vertically stacked to constitute the semiconductor package 13. Thus, the semiconductor package 13 may provide a compact package with a large capacity.

According to various embodiments, the semiconductor package 10 may be provided to include the semiconductor die 100 and the bridge die 200 spaced part from the semiconductor die 100. In addition, the semiconductor package 10 including the semiconductor die 100 and the bridge die 200 spaced part from the semiconductor die 100 may be used as each of a plurality of sub-packages, which are vertically stacked, to provide the semiconductor package 13 corresponding to a stack package.

Figure 10:
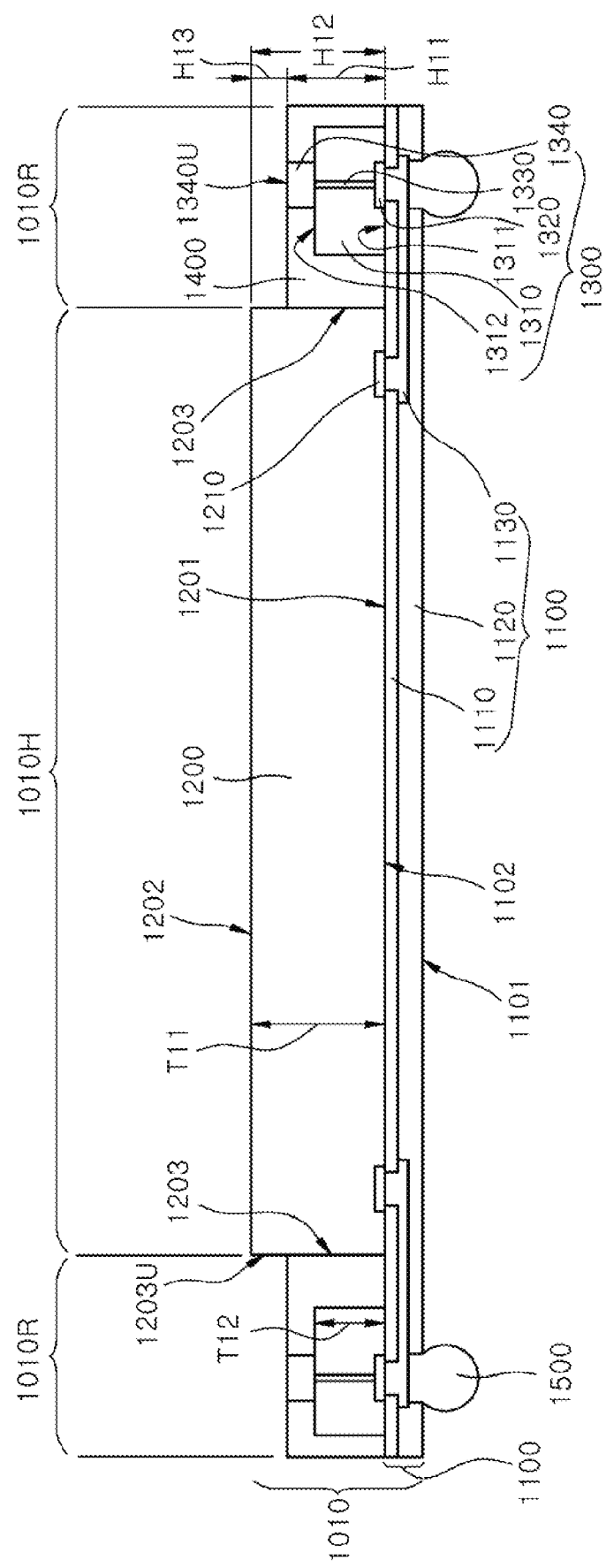
FIG. 10 is a cross-sectional view illustrating a sub-package of a semiconductor package according to an embodiment.

FIG. 10 is a cross-sectional view, illustrating a first sub-package 1010 of a semiconductor package, according to an embodiment.

Referring to FIG. 10, the first sub-package 1010 may be a unit component of a semiconductor package, according to an embodiment. The unit component, such as the first sub-package 1010, may be repeatedly and vertically stacked to form the semiconductor package. The first sub-package 1010 may be configured to include a first redistribution line structure 1100, a first semiconductor die 1200, first bridge dies 1300 and a first molding layer 1400. In the following descriptions, the terms "first," "second," etc. are only used to distinguish one element from another element, but not used to mean a particular sequence of the elements.

The first semiconductor die 1200 may be disposed on the first redistribution line structure 1100. The first redistribution line structure 1100 may include a top surface 1102 and a bottom surface 1101, the two surfaces being opposite to each other. The first semiconductor die 1200 may also include a bottom surface 1201 and a top surface 1202 which are opposite to each other as well. The first semiconductor die 1200 may be mounted on the first redistribution line structure 1100 such that the bottom surface 1201 of the first semiconductor die 1200 faces the top surface 1102 of the first redistribution line structure 1100. The first semiconductor die 1200 may be electrically connected to the first redistribution line structure 1100.

The first bridge dies 1300 may be disposed on the first redistribution line structure 1100. The first bridge dies 1300 may be disposed to be laterally spaced apart from the first semiconductor die 1200. In such a case, the first bridge dies 1300 may be disposed at both sides of the first semiconductor die 1200, respectively. The first redistribution line structure 1100 may extend to have extensions, laterally protruding from side surfaces of the first semiconductor die 1200, when viewed from a plan view. The first bridge dies 1300 may be disposed on the extensions of the first redistribution line structure 1100.

The first molding layer 1400 may be formed to cover portions of the top surface 1102 of the first redistribution line structure 1100. The first molding layer 1400 may extend to be in contact with the top surface 1102 of the first redistribution line structure 1100. The first molding layer 1400 may fix the first semiconductor die 1200 and the first bridge dies 1300. The first molding layer 1400 may extend to partially cover side surfaces 1203 of the first semiconductor die 1200. The first molding layer 1400 may surround the side surfaces 1203 of the first semiconductor die 1200.

The first molding layer 1400 may be disposed to reveal upper portions 1203U of the side surfaces 1203 of the first semiconductor die 1200. The first molding layer 1400 may be disposed to reveal the top surface 1202 of the first semiconductor die 1200. Because the first molding layer 1400 is disposed to reveal the upper portions 1203U of the side surfaces 1203 of the first semiconductor die 1200 and an entire portion of the top surface 1202 of the first semiconductor die 1200, the heat, generated by operation of the first semiconductor die 1200, may be more readily emitted from the first semiconductor die 1200 toward an outside region of the first semiconductor die 1200. Thus, it may be possible to suppress or prevent the performance degradation of the first semiconductor die 1200 by the heat trapped in the first semiconductor die 1200.

The first molding layer 1400 may extend to fill spaces between the first semiconductor die 1200 and the first bridge dies 1300. The first molding layer 1400 may extend to partially surround the side surfaces of the first bridge dies 1300.

The first molding layer 1400 may be formed to include one of the various types of encapsulant materials or any one of the various types of dielectric materials. For example, the first molding layer 1400 may be formed using a molding process with an epoxy molding compound (EMC) material. After an EMC layer is formed to cover the first semiconductor die 1200 and the first bridge dies 1300, the EMC layer may be recessed to expose the top surface 1202 of the first semiconductor die 1200.

The EMC layer may be recessed by partially etching the EMC layer, covering the first semiconductor die 1200 and the first bridge dies 1300, thereby exposing the upper portions 1203U of the side surfaces 1203 of the first semiconductor die 1200. The first molding layer 1400 may be recessed to expose top surfaces 1340U of first post bumps 1340, included in each of the first bridge dies 1300.

The first redistribution line structure 1100 may directly contact the first semiconductor die 1200, the first bridge dies 1300 and the first molding layer 1400, unlike a printed circuit board (PCB) or a silicon interposer. The first redistribution line structure 1100 may have a multi-layered structure, including a first dielectric layer 1110, a second dielectric layer 1120, and a first redistributed line patterns 1130, disposed between the first and second dielectric layers 1110 and 1120.

A structure (i.e., the first redistribution line structure 1100) in which the first dielectric layer 1110, the first redistributed line patterns 1130 and the second dielectric layer 1120 are integrated may be in direct contact with a bottom surface of a structure, including the first semiconductor die 1200, the first bridge dies 1300 and the first molding layer 1400. As such, since the first redistribution line structure 1100 has a laminated structure, the first sub-package 1010 may have a relatively thin structure as compared with a case when the first redistribution line structure 1100 is replaced with a PCB or an interposer.

The first redistribution line structure 1100 may act as an interconnection structure that electrically connects the first semiconductor die 1200 to the first bridge dies 1300. The first redistributed line patterns 1130 of the first redistribution line structure 1100 may be conductive patterns for electrically connecting first connection pads 1210 of the first semiconductor die 1200 to first via pads 1320 of the first bridge dies 1300. The first connection pads 1210 of the first semiconductor die 1200 may be electrical connection terminals, disposed on the bottom surface 1201 of the first semiconductor die 1200. The first via pads 1320 of the first bridge dies 1300 may be electrical connection terminals, disposed on bottom surfaces of the first bridge dies 1300 (i.e., bottom surfaces 1311 of first bodies 1310 of the first bridge dies 1300).

The first ends of the first redistributed line patterns 1130 may be bonded to the first connection pads 1210, and the second ends of the first redistributed line patterns 1130 may be bonded to the first via pads 1320. The first redistributed line patterns 1130 may be formed by depositing a conductive material on the first dielectric layer 1110 and by patterning the conductive material with an etching process. Alternatively, the first redistributed line patterns 1130 may be formed through an electroplating process. The first redistributed line patterns 1130 may be formed to include a metal layer such as a copper layer.

The first redistribution line structure 1100 may also act as an interconnection structure to electrically connect the first semiconductor die 1200 to an external device, an external substrate, or an external module. The outer connectors 1500 may be electrically connected to the first redistributed line patterns 1130 of the first redistribution line structure 1100. The outer connectors 1500 may be solder balls.

Figure 11:
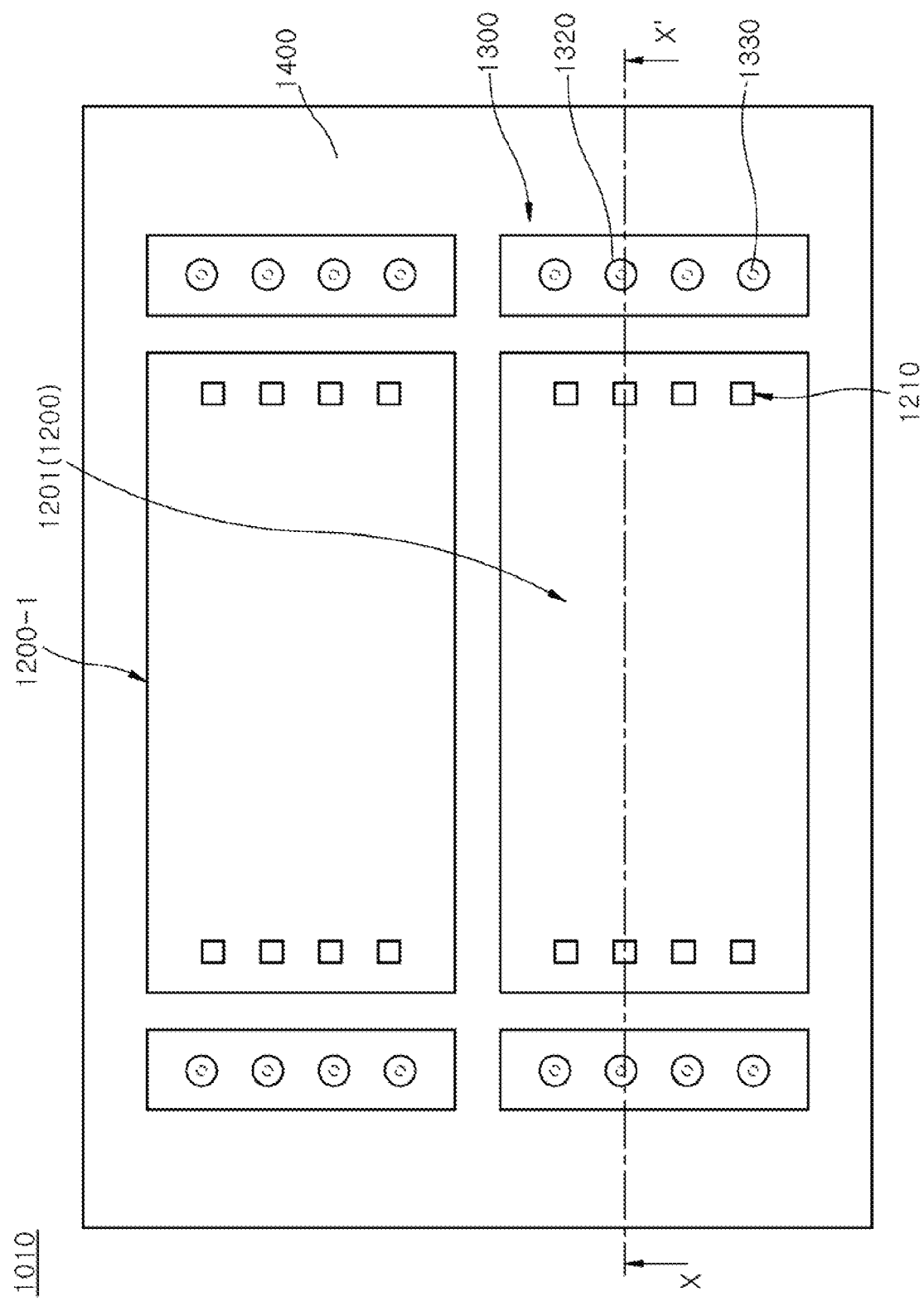
FIG. 11 is a plan view illustrating a sub-package of a semiconductor package according to an embodiment.

FIG. 11 is a plan view, illustrating the first sub-package 1010 of FIG. 1. FIG. 10 is a cross-sectional view, taken along a line X-X' of FIG. 11. FIG. 11 corresponds to a bottom view of the first semiconductor die 1200, the first bridge dies 1300, and the first molding layer 1400.

Referring to FIGS. 10 and 11, an additional first semiconductor die 1200-1 may be disposed to be spaced apart from the first semiconductor die 1200. In such a case, two additional first bridge dies 1300 may also be disposed at both sides of the additional first semiconductor die 1200-1, respectively. Each of the first bridge dies 1300 may include a plurality of first through vias 1330, and the first via pads 1320 may be connected to the respective first through vias 1330.

Figure 12:
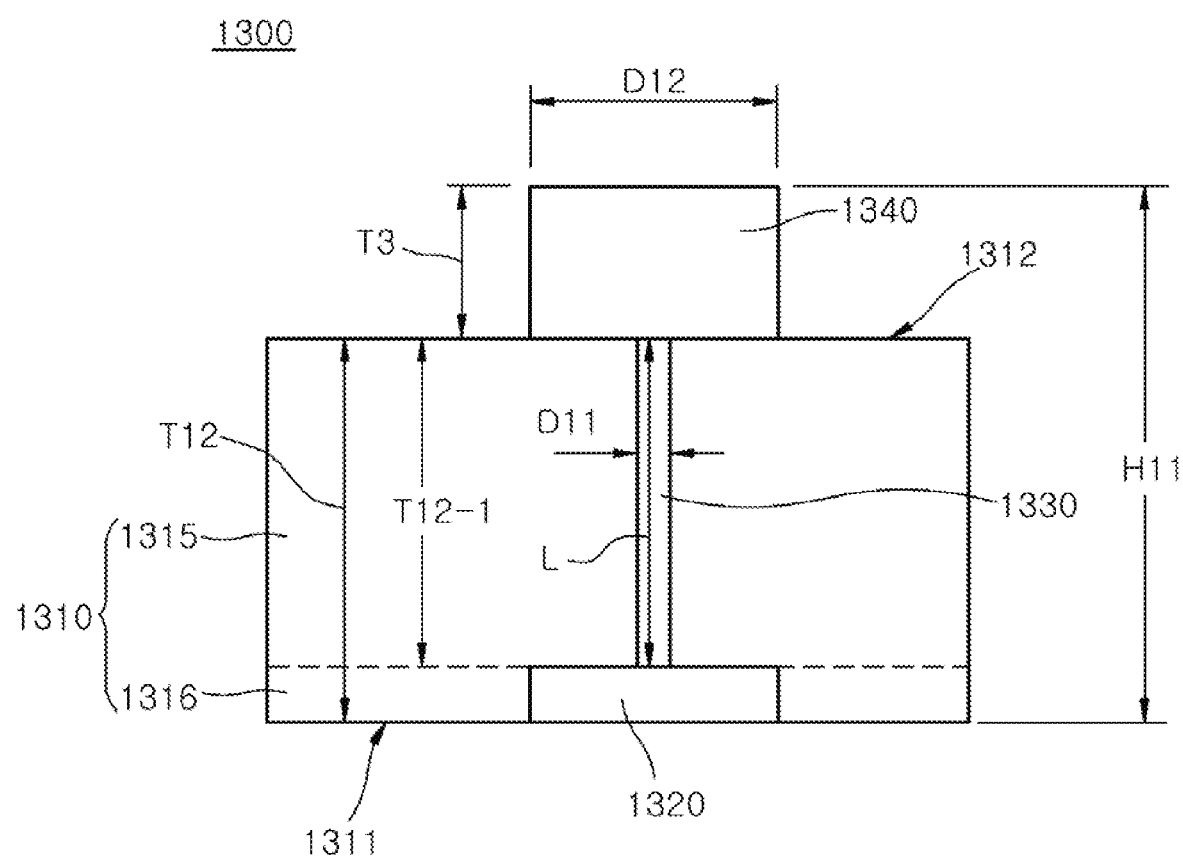
FIG. 12 is a cross-sectional view illustrating a bridge die of a semiconductor package according to an embodiment.

FIG. 12 is a cross-sectional view, illustrating the first bridge die 1300, included in the semiconductor package according to an embodiment.

Referring to FIGS. 10 and 12, the first bridge die 1300 may be configured to include the first body 1310, the first via pad 1320, the first through via 1330, and the first post bump 1340. The first body 1310 may be a substrate, having a bottom surface 1311 and a top surface 1312, the surfaces being opposite to each other. The first body 1310 may be a semiconductor substrate, such as a silicon substrate. In some other embodiments, the first body 1310 may be a dielectric substrate. When the first body 1310 is a silicon substrate, it may be advantageous to form the first through via 1330 using semiconductor processes.

The first through via 1330 may vertically penetrate the first body 1310. That is, the first through via 1330 may extend from the bottom surface 1311 of the first body 1310 to the top surface 1312 of the first body 1310. When the first through via 1330 is formed, some semiconductor processes, including a photolithography process applied to a silicon wafer, may be used.

Accordingly, the first through via 1330 may be a through silicon via (TSV) having a fine diameter D11. The first through via 1330 may include a copper layer. The TSV may have a relatively small diameter as compared to a through mold via (TMV). Thus, it may be possible to increase the number of the first through vias 1330 formed in a limited area. Because the TMV has a diameter which is greater than a diameter of the TSV, it may be difficult to form the TMVs densely in a limited area, contrary to the TSVs.

As described above, the first through vias 1330 may be formed using a TSV technique. Thus, it may be possible to form the first through vias 1330 in a limited area of the first body 1310 such that the first through vias 1330 correspond to a lot of input/output (I/O) terminals and power/ground terminals of the first bridge die 1300.

If the diameter D11 of the first through vias 1330 is reduced, the length L of the first through vias 1330 may also be reduced. The first body 1310 may be configured to include a core portion 1315 where the first through vias 1330 substantially penetrate and a third dielectric layer 1316 covering the core portion 1315. The third dielectric layer 1316 may be a dielectric layer that electrically isolates and insulates the first via pads 1320 from each other. The core portion 1315 may be a silicon substrate. The first via pads 1320 may be connection elements that connect the first through vias 1330 to the first redistributed line patterns (1130 of FIG. 10) of the first redistribution line structure (1100 of FIG. 10).

The first through vias 1330 may be formed to have the length L corresponding to a thickness T12-1 of the core portion 1315, and the thickness T12-1 of the core portion 1315 may be less than a thickness T12 of the first body 1310. In such a case, there may be a limitation in reducing the diameter D11 of the first through vias 1330 in the first bridge die 1300, due to the restriction of an aspect ratio of a through hole, in which each of the first through vias 1330 is formed. In order to reduce the diameter D11 of the first through vias 1330 in the first bridge die 1300, it may be necessary to reduce the thickness T12 of the first body 1310 or the thickness T12-1 of the core portion 1315 to overcome the restriction of the aspect ratio of the through hole in which each of the first through vias 1330 is formed. If the thickness T12 of the first body 1310 becomes less than a thickness (T11 of FIG. 10) of the first semiconductor die 1200, the diameter D11 of the first through vias 1330 may also be reduced. Accordingly, it may be possible to increase the number of first through vias 1330, which are formed in the first body 1310.

The first via pads 1320 of the first bridge die 1300 may be disposed on a bottom surface of the first bridge die 1300 (i.e., the bottom surface 1311 of the first body 1310), to be connected to the first through vias 1330. The first via pads 1320 may be electrical connection terminals disposed to overlap with the first through vias 1330.

The first post bumps 1340 may be connected to the first through vias 1330. The first post bumps 1340 may be disposed on top surfaces of the first through vias 1330, opposite to the first via pads 1320. The first post bumps 1340 may be disposed to protrude from the top surface 1312 of the first body 1310. The first post bumps 1340 may have a diameter D12, which is greater than the diameter D11 of the first through vias 1330. The first post bumps 1340 may have a vertical height, corresponding to a thickness T13 from the top surface 1312 of the first body 1310, to compensate for the thickness T12 of the first body 1310.

As a result, the first bridge die 1300 may have a first height H11 corresponding to the sum of the thickness T12 of the first body 1310 and the thickness T13 of the first post bumps 1340. Because of the presence of the first post bumps 1340, it may be possible to relatively reduce the thickness T12 of the first body 1310 without decreasing the first height H11 of the first bridge die 1300. Thus, the diameter D11 of the first through vias 1330 may be further reduced to increase the number of the first through vias 1330 that are formed in the limited area of the first body 1310.

Referring back to FIG. 10, the first bridge dies 1300 may have the first height H11 and may be disposed on the first redistribution line structure 1100. The first height H11 may correspond to a distance between the level of the top surface 1102 of the first redistribution line structure 1100 and the level of the top surface 1340U of the first post bump 1340. The first semiconductor die 1200 may have a second height H12 and may be disposed between the first bridge dies 1300. The second height H12 may correspond to a distance between the level of the top surface 1102 of the first redistribution line structure 1100 and the level of the top surface 1202 of the first semiconductor die 1200. The first height H11 of the first bridge die 1300 may be less than the second height H12 of the first semiconductor die 1200. Thus, there may be a level difference H13 between the first bridge die 1300 and the first semiconductor die 1200. The level difference H13 may exist because the first height H11 of the first bridge die 1300 is less than the second height H12 of the first semiconductor die 1200. The top surface 1340U of the first post bump 1340 may be located at a level which is lower than a level of the top surface 1202 of the first semiconductor die 1200 by the level difference H13.

Because the level difference H13 exists between the first bridge die 1300 and the first semiconductor die 1200, the first sub-package 1010 may have a central portion 1010H and a recessed edge portion 1010R, whose top surface is lower than a top surface of the central portion 1010H. Accordingly, the central portion 1010H and the recessed edge portion 1010R of the first sub-package 1010 may provide a step structure, which is due to the level difference H13.

The central portion 1010H of the first sub-package 1010 may be a region in which the first semiconductor die 1200 is disposed. A top surface of the first sub-package 1010 may correspond to the top surface 1202 of the first semiconductor die 1200. The recessed edge portion 1010R of the first sub-package 1010 may be a region in which the first bridge dies 1300 are disposed. A top surface of the recessed edge portion 1010R of the first sub-package 1010 may include the top surfaces 1340U of the first post bumps 1340 and a top surface of the first molding layer 1400. The top surfaces 1340U of the first post bumps 1340 may be revealed at the top surface of the first molding layer 1400. The first molding layer 1400 may be disposed to surround side surfaces of the first post bumps 1340 and to cover the first body 1310.

Figure 13:
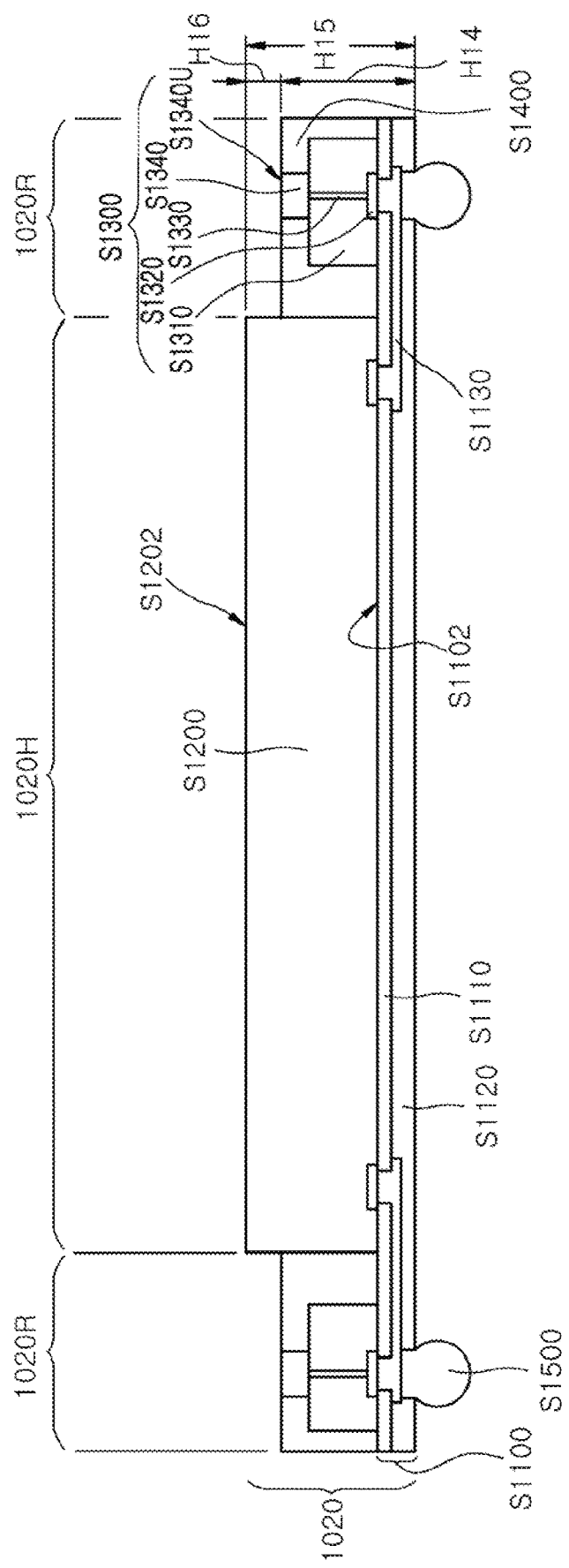
FIG. 13 is a cross-sectional view illustrating a sub-package of a semiconductor package according to an embodiment.

FIG. 13 is a cross-sectional view, illustrating a second sub-package 1020 of a semiconductor package, according to an embodiment.

Referring to FIG. 13, the second sub-package 1020 may be configured to have substantially the same shape as the first sub-package 1010, shown in FIG. 10. The second sub-package 1020 may be configured to include substantially the same elements as the first sub-package 1010, shown in FIG. 10. The second sub-package 1020 may have substantially the same structure as the first sub-package 1010, shown in FIG. 10. The second sub-package 1020 may be configured to include a second redistribution line structure S1100, a second semiconductor die S1200, second bridge dies S1300 and a second molding layer S1400.

The second bridge dies S1300 may have a fourth height H14 and may be disposed on the second redistribution line structure S1100. The fourth height H14 may correspond to the distance between the level of a top surface S1102 of the second redistribution line structure S1100 and the level of top surfaces 51340U of second post bumps S1340 in the second bridge dies S1300. The second semiconductor die S1200 may have a fifth height H15 and may be disposed between the second bridge dies S1300. The fifth height H15 may correspond to the distance between the level of the top surface S1102 of the second redistribution line structure S1100 and the level of a top surface S1202 of the second semiconductor die S1200. The fourth height H14 of the first bridge die S1300 may be less than the fifth height H15 of the second semiconductor die S1200. Thus, there may be a level difference H16 between the second bridge die S1300 and the second semiconductor die S1200. The level difference H16 may exist because the fourth height H14 of the second bridge die S1300 is less than the fifth height H15 of the second semiconductor die S1200.

Because the level difference H16 exists between the second bridge die S1300 and the second semiconductor die S1200, the second sub-package 1020 may have a central portion 1020H and a recessed edge portion 1020R whose top surface is lower than the top surface of the central portion 1020H. Accordingly, the central portion 1020H and the recessed edge portion 1020R of the second sub-package 1020 may provide a step structure, which is due to the level difference H16.

Each of the second bridge dies S1300 may be configured to include a second body S1310, a second via pad S1320, a second through via S1330, and a second post bump S1340. The second molding layer S1400 may surround the side surfaces of the second bridge dies S1300 and the second semiconductor die S1200 to reveal the top surfaces S1340U of the second post bumps S1340. The second redistribution line structure S1100 may include the second redistribution line patterns S1130, the third dielectric layer S1110 and the fourth dielectric layer S1120. The third dielectric layer S1110 and the fourth dielectric layer S1120 may be disposed to electrically isolate and insulate the second redistribution line patterns S1130 from each other.

The second redistribution line structure S1100 may act as an interconnection structure that electrically connects the second semiconductor die S1200 to the first semiconductor die (1200 of FIG. 10), the first bridge dies, (1300 of FIG. 10) or an external device. Vertical connectors S1500 may be electrically connected to the second redistributed line patterns S1130 of the second redistribution line structure S1100. The vertical connectors S1500 may function as connection members that connect upper elements to lower elements, located under the upper elements. The vertical connectors S1500 may be solder balls or conductive bumps.

Figure 14:
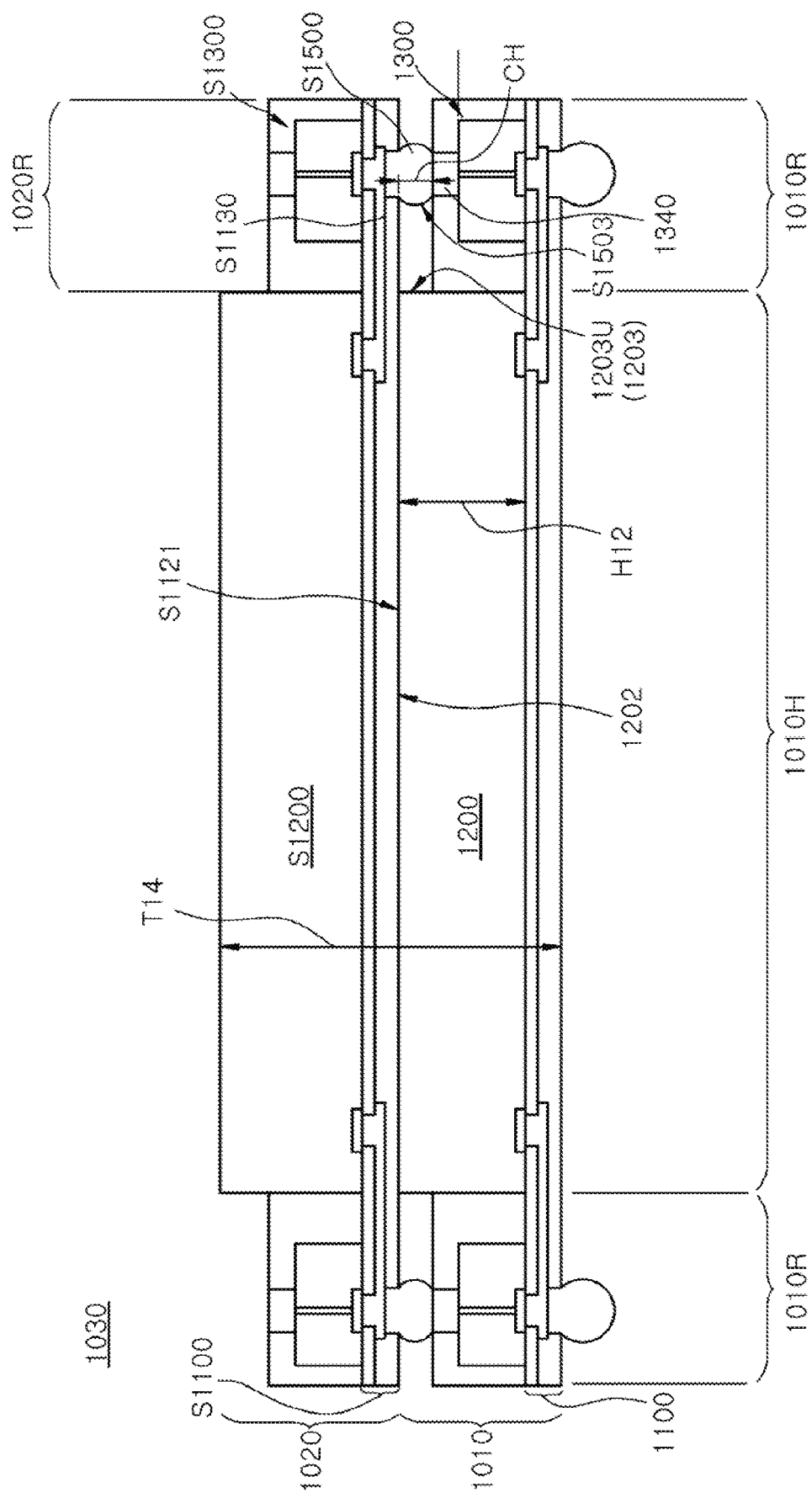
FIG. 14 is a cross-sectional view illustrating a semiconductor package according to an embodiment.
Figure 15:
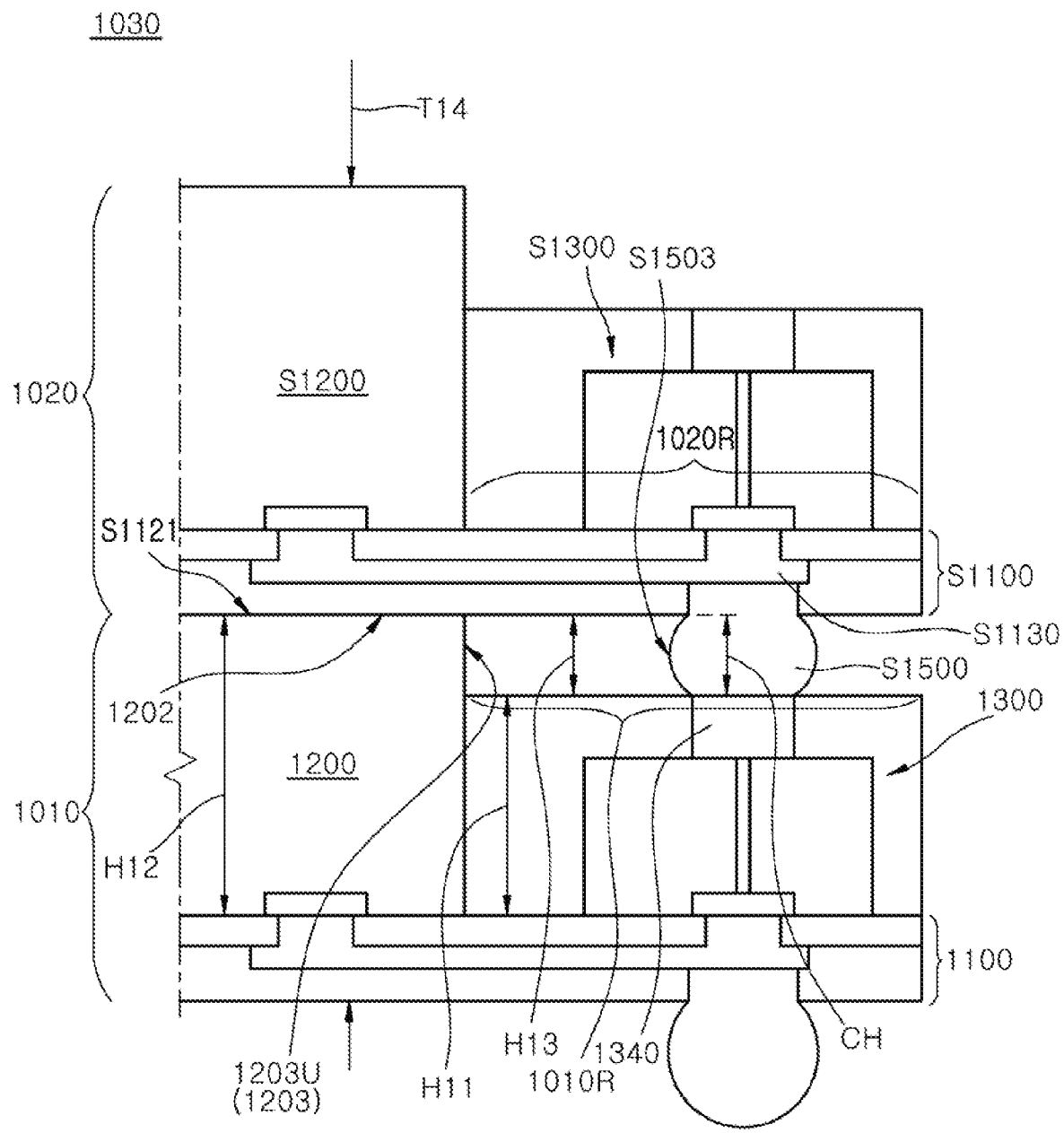
FIG. 15 is an enlarged view of bridge dies included in the semiconductor package of FIG. 14.

FIG. 14 is a cross-sectional view, illustrating a semiconductor package 1030, according to an embodiment. FIG. 15 is an enlarged view of the first and second bridge dies 1300 and S1300, included in the semiconductor package 1030 of FIG. 14.

Referring to FIG. 14, the semiconductor package 1030 may be configured to include the first sub-package 1010 and the second sub-package 1020, which are sequentially stacked. The second sub-package 1020 may be vertically stacked on the first sub-package 1010. The bottom surface of the second sub-package 1020 may be in direct contact with the top surface of the first sub-package 1010. The bottom surface of the second sub-package 1020 may correspond to the bottom surface S1121 of the second redistribution line structure S1100. The top surface of the first sub-package 1010 may correspond to the top surface 1202 of the first semiconductor die 1200. Thus, the bottom surface S1121 of the second redistribution line structure S1100 may be in direct contact with the top surface 1202 of the first semiconductor die 1200. The top surface of the central portion 1010H of the first sub-package 1010 may be in direct contact with the bottom surface of the second sub-package 1020 corresponding to the bottom surface S1121 of the second redistribution line structure S1100.

Because the bottom surface of the second sub-package 1020 is in direct contact with the top surface 1202 of the first sub-package 1010, the total thickness of the first and second sub-packages 1010 and 1020 (i.e., a thickness T14 of the semiconductor package 1030) may be minimized. That is, the thickness T14 of the semiconductor package 1030, including the first and second sub-packages 1010 and 1020, vertically contacting each other, may be reduced as compared to the comparative example in which the first and second sub-packages are stacked to be vertically spaced apart from each other.

Referring to FIGS. 14 and 15, in the semiconductor package 1030, the recessed portion 1020R of the second sub-package 1020 may correspond to the portion that laterally protrudes from the second semiconductor die S1200 to vertically overlap with the recessed edge portion 1010R of the first sub-package 1010. Hereinafter, the recessed portion 1020R of the second sub-package 1020 may be referred to as a protrusion of the second sub-package 1020. The protrusion 1020R of the second sub-package 1020 may protrude to be located over the recessed edge portion 1010R of the first sub-package 1010. The protrusion 1020R of the second sub-package 1020 may include a protrusion of the second redistribution line structure S1100. The protrusion of the second redistribution line structure S1100 might not protrude to vertically overlap with the first semiconductor die 1200.

The protrusion 1020R of the second sub-package 1020 may be vertically spaced apart from the recessed edge portion 1010R of the first sub-package 1010. The first sub-package 1010 may have the central portion 1010H and the recessed edge portion 1010R lower than the central portion 1010H, thereby providing a step structure. Thus, the protrusion 1020R, corresponding to an edge portion of the second sub-package 1020, contacting the first sub-package 1010, may laterally protrude from the second semiconductor die S1200 to act as an overhang.

The vertical connectors S1500 may be disposed between the protrusion 1020R of the second sub-package 1020 and the recessed edge portion 1010R of the first sub-package 1010. The vertical connectors S1500 may be disposed on the recessed edge portion 1010R of the first sub-package 1010 to support the protrusion 1020R of the second sub-package 1020.

The vertical connectors S1500 may have a third height CH. The third height CH may correspond to a distance between the level of the top surface of the recessed edge portion 1010R of the first sub-package 1010 and the level of the bottom surface S1121 of the second redistribution line structure S1100 (i.e., the bottom surface of the second sub-package 1020). The third height CH of the vertical connectors S1500 may have an appropriate value for compensating for the level difference H13, corresponding to the distance between the protrusion 1020R of the second sub-package 1020 and the recessed edge portion 1010R of the first sub-package 1010. Because the vertical connectors S1500 compensate for the level difference H13, the third height CH of the vertical connectors S1500 may correspond to the difference between the first height H11 of the first bridge die 1300 and the second height H12 of the first semiconductor die 1200.

The vertical connectors S1500 may electrically connect the first post bumps 1340 of the first bridge die 1300 of the first sub-package 1010 to the second redistributed line patterns S1130 of the second redistribution line structure S1100 of the second sub-package 1020. As a result, the vertical connectors S1500 may provide vertical paths that electrically connect the first sub-package 1010 to the second sub-package 1020. The vertical connectors S1500 may electrically connect the first and second semiconductor dies 1200 and S1200 to each other. The vertical connectors S1500 may be located on the recessed edge portion 1010R of the first sub-package 1010. Accordingly, the upper portions 1203U of the side surfaces 1203 of the first semiconductor die 1200 may face side surfaces S1503 of the vertical connectors S1500.

Referring again to FIGS. 14 and 15, because the first sub-package 1010 includes the central portion 1010H and the recessed edge portion 1010R lower than the central portion 1010H to provide a step structure, the vertical connectors S1500, on the recessed edge portion 1010R, may extend in a downward direction from the level of the top surface 1202 of the first sub-package 1010. Thus, the bottom surface of the second sub-package 1020 may be in contact with the top surface 1202 of the first sub-package 1010. In a comparative example, if a first sub-package, corresponding to the first sub-package 1010, has a flat top surface without any step structure, the vertical connectors corresponding to the vertical connectors S1500 may be disposed to protrude from the flat top surface of the first sub-package. In such a case, the second sub-package, corresponding to the second sub-package 1020, may be vertically spaced apart from the first sub-package by the height of the vertical connectors. Thus, a semiconductor package, according to the comparative example including the first and second sub-packages, vertically spaced apart from each other by the vertical connectors, may have a thickness greater than the thickness T14 of the semiconductor package 1030, shown in FIG. 14. That is, the thickness T14 of the semiconductor package 1030, shown in FIG. 14, may be less than the thickness of the semiconductor package according to the comparative example. Accordingly, the present embodiment may provide a thin and compact semiconductor package.

Figure 16:
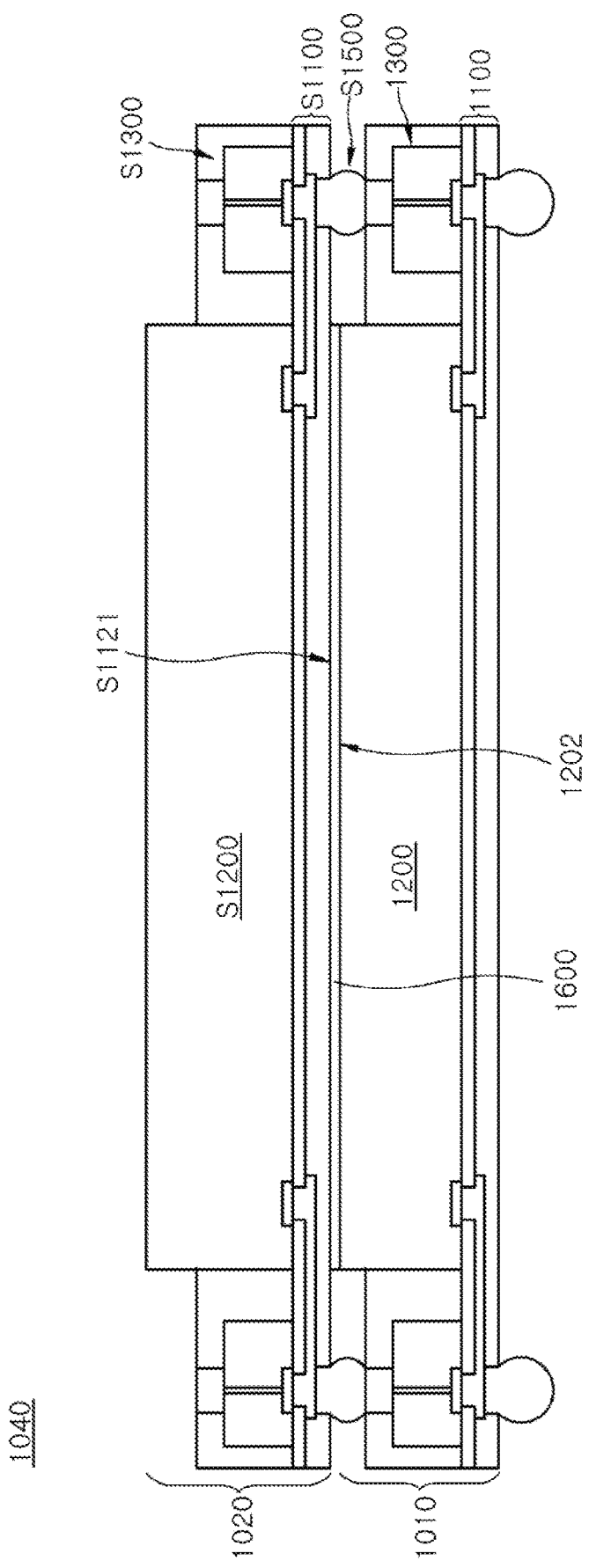
FIG. 16 is a cross-sectional view illustrating a semiconductor package according to an embodiment.

FIG. 16 is a cross-sectional view, illustrating a semiconductor package 1040, according to an embodiment.

Referring to FIG. 16, the semiconductor package 1040 may further include an organic material layer 1600, disposed between the top surface 1202 of the first sub-package 1010 and a bottom surface of the second sub-package 1020 (i.e., the bottom surface S1121 of the second redistributed line structure S1100 as compared with the semiconductor package 1030). The organic material layer 1600 may be a film-shaped layer. The organic material layer 1600 may be an adhesive layer to attach the second sub-package 1020 to the first sub-package 1010. The organic material layer 1600, acting as an adhesive layer, may fix the second sub-package 1020 to the first sub-package 1010 to prevent or suppress any undesirable positional change of the second sub-package 1020.

Figure 17:
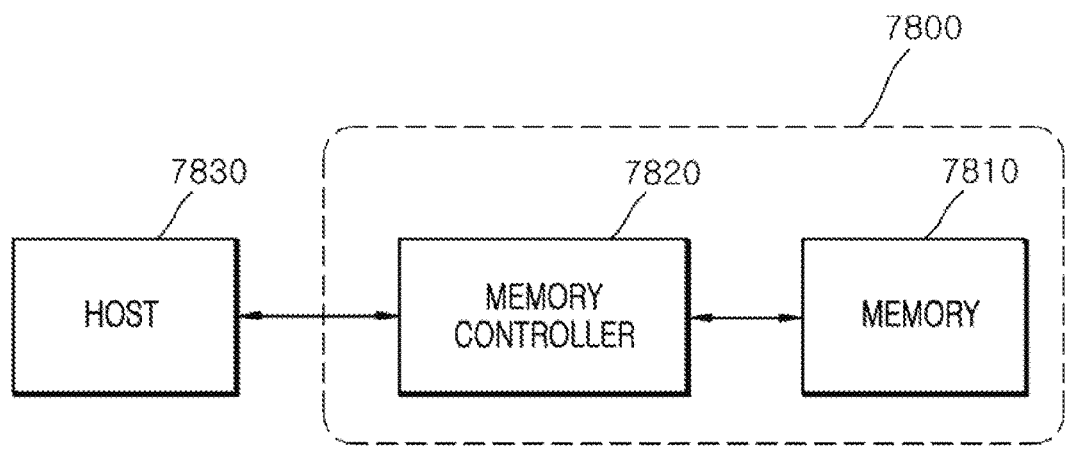
FIG. 17 is a block diagram illustrating an electronic system employing a memory card including at least one of semiconductor packages according to various embodiments.

FIG. 17 is a block diagram illustrating an electronic system including a memory card 7800 employing at least one semiconductor package according to embodiments of the present disclosure. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one semiconductor package according to embodiments of the present disclosure.

The memory 7810 may include a nonvolatile memory device fabricated according to embodiments of the present disclosure. The memory controller 7820 may control the memory 7810 such that stored data is read out or data is stored in response to a read/write request from a host 7830.

Figure 18:
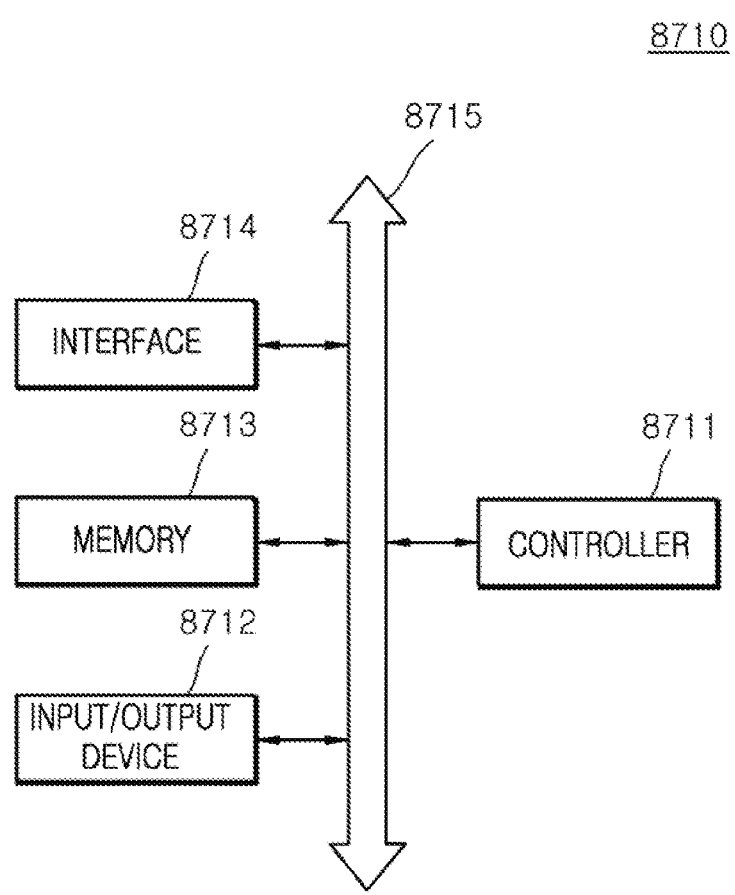
FIG. 18 is a block diagram illustrating another electronic system including at least one of semiconductor packages according to various embodiments.

FIG. 18 is a block diagram illustrating an electronic system 8710 including at least one semiconductor package according to embodiments of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more semiconductor packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution) or WiBro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor package comprising:
    a first semiconductor die disposed on a first redistributed line structure;
    a first bridge die, disposed on the first redistributed line structure to provide a level difference between the first semiconductor die and the first bridge die, the first bridge die having a height that is less than a height of the first semiconductor die;
    a second redistributed line structure, stacked on the first semiconductor die, wherein the second redistributed line structure is disposed to have a protrusion, laterally protruding from a side surface of the first semiconductor die when viewed from a plan view;
    a second semiconductor die, disposed on the second redistributed line structure; and
    a vertical connector, disposed between the first bridge die and the protrusion of the second redistributed line structure to support the protrusion,
    wherein the first bridge die includes a first through via,
    wherein the second redistributed line structure includes a redistributed line pattern and a dielectric layer, and
    wherein the dielectric layer is in contact with a top surface of the first semiconductor die such that the redistributed line pattern is isolated from the first semiconductor die.

2. The semiconductor package of claim 1, wherein the first bridge die includes:
    a first body through which the first through via vertically passes; and
    a first post bump, disposed on the first body, to upwardly protrude from the first body, electrically connected to the first through via,
    wherein the vertical connector electrically connects the first post bump to the protrusion of the second redistributed line structure.

3. The semiconductor package of claim 2, wherein the level difference exists because a first height, from the first redistributed line structure to a level of a top surface of the first post bump, is less than a second height, from the first redistributed line structure to a level of the top surface of the first semiconductor die.

4. The semiconductor package of claim 3, wherein the vertical connector has a third height, corresponding to a difference between the first height and the second height.

5. The semiconductor package of claim 4, wherein the vertical connector includes a solder ball.

6. The semiconductor package of claim 2, further comprising a first molding layer, surrounding the first bridge die and the first semiconductor die,
    wherein the first molding layer surrounds the first post bump and covers the first body of the first bridge die.

7. The semiconductor package of claim 6, wherein the first molding layer is disposed to reveal an upper portion of side surfaces of the first semiconductor die and the top surface of the first semiconductor die.

8. The semiconductor package of claim 2, wherein the first post bump has a second diameter, which is greater than a first diameter of the first through via.

9. The semiconductor package of claim 1, wherein the vertical connector is disposed such that a side surface of the first semiconductor die faces a side surface of the vertical connector.

10. The semiconductor package of claim 1, further comprising an organic material layer, disposed between the top surface of the first semiconductor die and the bottom surface of the second redistributed line structure.

11. The semiconductor package of claim 1, further comprising:
    a second bridge die, disposed on the second redistributed line structure, providing a level difference between the second semiconductor die and having a height which is less than a height of the second semiconductor die, wherein the second bridge die includes a second through via and a second post bump; and a second molding layer surrounding the second bridge die and the second semiconductor die to reveal a top surface of the second post bump.

12. A semiconductor package comprising:

a first sub-package, including a central portion and a recessed edge portion, with a top surface of the recessed edge portion being lower than a top surface of the central portion;

a second sub-package stacked on the first sub-package such that a bottom surface of the second sub-package is in contact with a top surface of the central portion of the first sub-package, wherein the second sub-package has a protrusion which is vertically spaced apart from the recessed edge portion of the first sub-package;

a vertical connector disposed on the recessed edge portion to support the protrusion of the second sub-package; and an organic material layer attaching the second sub-package to the first sub-package and disposed between the top surface of the first sub-package and the bottom surface of the second sub-package, wherein the first sub-package includes:
   a first redistributed line structure;
   a first semiconductor die disposed on the first redistributed line structure;
   a first bridge die disposed on the first redistributed line structure to provide a level difference between the first semiconductor die and the first bridge die, the first bridge die having a height which is less than a height of the first semiconductor die, wherein the first bridge die includes a first through via and a first post bump; and
   a first molding layer, surrounding the first bridge die and the first semiconductor die to reveal a top surface of the first post bump, and wherein the vertical connector is connected to the first post bump.

13. The semiconductor package of claim 12, wherein the level difference exists because a first height, from the first redistributed line structure to a level of a top surface of the first post bump, is less than a second height, from the first redistributed line structure to a level of the top surface of the first semiconductor die.

14. The semiconductor package of claim 13, wherein the vertical connector has a third height, corresponding to a difference between the first height and the second height.

15. The semiconductor package of claim 12, wherein the first redistributed line structure includes:
   a redistributed line pattern, electrically connecting the first semiconductor die to the first through via; and
   a dielectric layer, isolating the redistributed line pattern.

16. The semiconductor package of claim 12, wherein the vertical connector is disposed such that a side surface of the first semiconductor die faces a side surface of the vertical connector.

17. The semiconductor package of claim 12, wherein the second sub-package includes:
   a second redistributed line structure;
   a second semiconductor die, disposed on the second redistributed line structure;
   a second bridge die, disposed on the second redistributed line structure, providing a level difference between the second semiconductor die and having a height which is less than a height of the second semiconductor die, wherein the second bridge die includes a second through via and a second post bump; and
   a second molding layer surrounding the second bridge die and the second semiconductor die to reveal a top surface of the second post bump.

18. The semiconductor package of claim 12, wherein the second sub-package has substantially the same structure as the first sub-package.

* * * * *